(12) United States Patent
Kodemura et al.

(10) Patent No.: US 6,492,443 B1
(45) Date of Patent: Dec. 10, 2002

(54) NORBORNENE POLYMER COMPOSITION

(75) Inventors: Junji Kodemura, Kawasaki (JP); Yasuo Tsunogae, Kawasaki (JP); Yasuhiro Wakizaka, Kawasaki (JP)

(73) Assignee: Nippon Zeon Co., Ltd., Tokyo (JP)

( * ) Notice: Subject to any disclaimer, the term of this patent is extended or adjusted under 35 U.S.C. 154(b) by 0 days.

(21) Appl. No.: 09/269,964

(22) PCT Filed: Oct. 9, 1997

(86) PCT No.: PCT/JP97/03651

§ 371 (c)(1),
(2), (4) Date: Apr. 7, 1999

(87) PCT Pub. No.: WO98/15595

PCT Pub. Date: Apr. 16, 1998

(30) Foreign Application Priority Data

Oct. 9, 1996 (JP) ............................................... 8-287688
Jul. 29, 1997 (JP) ............................................... 9-218066

(51) Int. Cl.[7] .............................. C08K 5/15; C08F 36/20
(52) U.S. Cl. ........................ 524/114; 525/107; 525/123; 525/132; 525/165; 525/180; 525/332.1
(58) Field of Search ......................... 524/114; 525/107, 525/123, 132, 165, 180, 332.1

(56) References Cited

U.S. PATENT DOCUMENTS 5,571,609 A * 11/1996 St. Lawrence et al. ...... 428/268
RE35,717 E * 1/1998 Nahm ......................... 526/166

FOREIGN PATENT DOCUMENTS

| JP | 53-88096 | 3/1978 |
| JP | 62-34924 | 2/1987 |
| JP | 62-240312 | 10/1987 |
| JP | 63-110213 | 5/1988 |
| JP | 2-133406 | 5/1990 |
| JP | 2-227424 | 9/1990 |
| JP | 2-276842 | 11/1990 |
| JP | 2-305814 | 12/1990 |
| JP | 3-14882 | 1/1991 |
| JP | 3-72512 | 3/1991 |
| JP | 3-74409 | 3/1991 |
| JP | 3-95235 | 4/1991 |
| JP | 3-122137 | 5/1991 |
| JP | 6-248164 | 9/1994 |
| JP | 7-82461 | 3/1995 |

* cited by examiner

*Primary Examiner*—Peter D. Mulcahy
(74) *Attorney, Agent, or Firm*—Dinsmore & Shohl LLP

(57) ABSTRACT

A norbornene resin composition comprising 100 parts by weight of a thermoplastic norbornene polymer and 1 to 150 parts by weight of a thermosetting resin.

23 Claims, No Drawings

NORBORNENE POLYMER COMPOSITION

TECHNICAL FIELD

The present invention relates to a norbornene polymer composition comprising a norbornene polymer and a thermosetting resin as essential components, moldings formed from the composition, prepregs with a reinforcing base material such as a glass cloth impregnated with the composition, laminates with such prepregs laminated on each other, laminates with a film formed of the composition on a metal layer.

The norbornene polymer composition according to the present invention is excellent in electrical properties such as dielectric constant and dielectric loss tangent and also in peel strength (adhesion property) to metal foils as electrical conductors.

BACKGROUND ART

With the advancement of techniques, there are strong demands for achieving the speeding up and high reliability of arithmetic processing, and high-density packaging in circuits mounted in precision apparatus such as electronic computers and communication machines, and so it is advanced to provide circuit boards with high performance such as multi-layer structure, high precision and minute processing.

Such a circuit board is produced by impregnating a reinforcing base material, for example, a glass cloth with a resin varnish, drying the varnish to form a sheet (prepreg) in a semi-cured state, laying up a copper foil or outer copper-clad sheet, the prepreg, inner copper-clad sheet, and the like in that order between mirror plates and then hot-pressing the resultant laminate to completely cure the resin. As a resin material, there has heretofore been used a phenol resin, epoxy resin, polyimide resin, fluororesin, polybutadiene resin or the like.

However, the dielectric constant and dielectric loss tangent of thermosetting resins such as the phenol resin, epoxy resin and polyimide resin are generally as high as at least 4.0 and at least 0.01, respectively, and so their electrical properties are insufficient. Therefore, circuit boards making use of these thermosetting resins have been difficult to achieve the speeding up and high reliability of arithmetic processing.

On the other hand, norbornene polymers having repeating units derived from a norbornene monomer are known to be suitable for use as various kinds of moldings, sealing materials for electronic parts, insulating materials and the like, since they have various properties such as low moisture-absorption property and excellent dielectric properties and scarcely contain impurities. For example, it has been proposed to use a hydrogenated product of an addition copolymer of tetracyclododecene and ethylene, or a ring-opening polymer of methylmethoxy-carbonyltetracyclododecene as an insulating material for circuit boards or a sealing material for electronic parts. In particular, norbornene (co)polymers obtained by addition polymerizing a norbornene monomer have excellent heat resistance and hence are suitable for use as sealing materials, insulating materials and the like for electronic parts.

However, the norbornene polymers have a demerit that their adhesion properties to metals are insufficient. Therefore, they have involved a problem that a film formed of the norbornene polymer separates from a metal layer or cracks.

It has heretofore been proposed to produce a circuit board excellent in electrical properties such as dielectric constant and dielectric loss tangent by crosslinking a thermoplastic norbornene polymer with an organic peroxide. For example, Japanese Patent Application Laid-Open No. 34924/1987 discloses a process for obtaining a crosslinked sheet, comprising kneading an norbornene copolymer obtained by addition polymerization of a norbornene type cyclic olefin and ethylene, and a crosslinking aid, grinding the resultant mixture, impregnating the ground mixture with a solution of an organic peroxide, removing the solution and then press molding it.

Japanese Patent Application Laid-Open No. 248164/1994 discloses a process in which a norbornene resin, an organic peroxide, a crosslinking aid and a flame retardant are uniformly dispersed in a solvent, and the solvent is then removed to crosslinking the resin by heating. This publication discloses Examples wherein laminated sheets and prepregs were produced by this process.

However, these conventional processes have involved a problem that even when a metal foil such as a copper foil is laminated on the resultant sheet or prepreg, peel strength (adhesion property) between the sheet or prepreg and the metal foil is insufficient.

DISCLOSURE OF THE INVENTION

It is an object of the present invention to provide a norbornene polymer composition excellent in electrical properties such as dielectric constant and dielectric loss tangent and also in adhesion property to metals.

Another object of the present invention is to provide various kinds of moldings, sheets, films, prepregs, and laminates suitable for use as circuit boards and the like using the norbornene polymer composition having such excellent properties.

The present inventors have carried out an extensive investigation with a view toward overcoming the above-described problems involved in the prior art. As a result, it has been found that when a norbornene polymer composition obtained by blending a specific amount of a thermosetting resin with a thermoplastic norbornene polymer is used to crosslink the composition, moldings, prepregs, laminates and the like excellent in electrical properties such as dielectric constant and dielectric loss tangent and adhesion property to metals are obtained.

When a modified norbornene polymer obtained by introducing a polar group such as an epoxy, carboxyl or hydroxyl group into an unmodified norbornene polymer by, for example, a graft-modifying process is used as the norbornene polymer, its compatibility with the thermosetting resin and the adhesion property of the resulting composition to metals can be improved. When a polymer having a high glass transition temperature is used as the norbornene polymer, the heat resistance, such as soldering heat resistance, of the resulting composition can be improved.

The present invention has been led to completion on the basis of these findings.

According to the present invention, there is thus provided a norbornene resin composition comprising 100 parts by weight of a thermoplastic norbornene polymer and 1 to 150 parts by weight of a thermosetting resin.

According to the present invention, there are also provided (1) a molding formed from such a composition, (2) a prepreg with a reinforcing base material impregnated with the composition, (3) a laminate obtained by laminating sheet-like moldings and/or prepregs obtained with the composition on one another and crosslinking them, (4) a laminate with a film formed of the composition laminated on a metal layer, and the like.

BEST MODE FOR CARRYING OUT THE INVENTION

Thermoplastic Norbornene Polymer:

The thermoplastic norbornene polymer useful in the practice of the present invention is a publicly known polymer disclosed in Japanese Patent Application Laid-Open No. 14882/1991, Japanese Patent Application Laid-Open No. 122137/1991, or the like. Specific examples thereof include hydrogenated products of ring-opening polymers of a norbornene monomer, addition polymers of a norbornene monomer, addition polymers of a norbornene monomer and another monomer (for example, olefin), and modified products of these polymers. As the modified products, are preferred those obtained by introducing a polar group such as an epoxy, carboxyl or hydroxyl group into these norbornene polymers, from the viewpoints of their compatibility with thermosetting resins and the adhesion property of the resulting compositions to metals.

(1) Monomer:

Norbornene monomer are publicly known compounds disclosed in the above-described publications and Japanese Patent Application Laid-Open Nos. 227424/1990 and 276842/1990, etc. Examples thereof include polycyclic hydrocarbons having a norbornene structure; alkyl-, alkenyl-, alkylidene- or aromatic-substituted derivatives thereof; derivatives substituted by a polar group such as a halogen, hydroxyl group, ester group, alkoxy group, cyano group, amide group, imide group or silyl group; alkyl-, alkenyl, alkylidene- or aromatic-substituted derivatives of the norbornene monomers having such a polar group; etc. Of these, the polycyclic hydrocarbons having a norbornene structure, and alkyl-, alkenyl, alkylidene- or aromatic-substituted derivatives thereof are preferred in that they are particularly excellent in chemical resistance and moisture resistance. More specifically, the following norbornene monomers may be mentioned.

Specific examples of the norbornene monomers include 5-methyl-2-norbornene, 5,5-dimethyl-2-norbornene, 5-ethyl-2-norbornene, 5-butyl-2-norbornene, 5-ethylidene-2-norbornene, 5-methoxycarbonyl-2-norbornene, 5-cyano-2-norbornene, 5-methyl-5-methoxycarbonyl-2-norbornene, 5-phenyl-2-norbornene, 5-phenyl-5-methyl-2-norbornene; dicyclopentadiene and its derivatives substituted like the above, such as 2,3-dihydrodicyclopentadiene; dimethanooctahydronaphthalene and its derivatives substituted like the above, such as 6-methyl-1,4:5,8-dimethano-1,4,4a,5,6,7,8, 8a-octahydronaphthalene, 6-ethyl-1,4:5,8-dimethano-1,4, 4a,5,6,7,8,8a-octahydronaphthalene, 6-ethylidene-1,4:5,8-dimethano-1,4,4a,5,6,7,8,8a-octahydronaphthalene, 6-chloro-1,4:5,8-dimethano-1,4,4a,5,6,7,8,8a-octahydronaphthalene, 6-cyano-1,4:5,8-dimethano-1,4,4a,5, 6,7,8,8a-octahydronaphthalene, 6-pyridyl-1,4:5,8-dimethano-1,4,4a,5,6,7,8,8a-octahydronaphthalene and 6-methoxycarbonyl-1,4:5,8-dimethano-1,4,4a,5,6,7,8,8a-octahydronaphthalene; addition products of cyclopentadiene and tetrahydroindene, and their derivatives substituted like the above, such as 1,4-dimethano-1,4,4a,4b,5,8,8a,9a-octahydrofluorene and 5,8-methano-1,2,3,4,4a,5,8,8a-octahydro-2,3-cyclopentadieno-naphthalene; and oligomers of cyclopentadiene and their derivatives substituted like the above, such as 4,9:5,8-dimethano-3a,4,4a,5,8,8a,9,9a-octahydro-1H-benzoindene and 4,11:5,10:6,9-trimethano-3a,4,4a,5,5a,6,9,9a,10,10a,11, 11a-dodecahydro-1H-cyclopentaanthracene.

These norbornene monomers may be used either singly or in any combination thereof. The content of bound norbornene monomer unit in the thermoplastic norbornene polymer is suitably selected as necessary for the end application intended. However, it is generally at least 30 wt. %, preferably at least 50 wt. %. It is particularly preferred that the content be at least 70 wt. %, since the heat resistance of such a polymer is high.

Since norbornene addition polymers are easy to be provided as polymers having excellent heat resistance, such a norbornene addition polymer is preferably used in field of which high soldering heat resistance is required. Examples of a norbornene monomer or substituted norbornene monomer used in preparing a norbornene addition polymer include (a) norbornene monomers having no other unsaturated bond than a carbon-carbon unsaturated bond participating in a polymerization reaction, (b) norbornene monomers having another unsaturated bond in addition to a carbon-carbon unsaturated bond participating in a polymerization reaction, (c) norbornene monomers having an aromatic ring, and (d) norbornene monomers having a polar group.

Respective examples of norbornene monomers belonging to the monomers (a) to (d) are mentioned though those mentioned above may be included.

(a) Specific examples of the norbornene monomers having no other unsaturated bond than a carbon-carbon unsaturated bond participating in a polymerization reaction include bicyclo[2.2.1]hept-2-ene derivatives such as bicyclo [2.2.1]hept-2-ene (i.e., norbornene), 5-methylbicyclo[2.2.1] hept-2-ene (i.e., 5-methyl-2-norbornene), 5-ethylbicyclo [2.2.1]hept-2-ene, 5-butylbicyclo[2.2.1]hept-2-ene, 5-hexylbicyclo[2.2.1]hept-2-ene and 5-decylbicyclo-[2.2.1] hept-2-ene; tetracyclo[4.4.1$^{2,5}$.1$^{7,10}$.0]-dodec-3-ene derivatives such as tetracyclo[4.4.1$^{2,5}$.1$^{7,10}$.0]-dodec-3-ene, 8-methyltetracyclo[4.4.1$^{2,5}$.1$^{7,10}$.0]-dodec-3-ene and 8-ethyltetracyclo[4.4.1$^{2,5}$.1$^{7,10}$.0]-dodec-3-ene; tricyclo [4.3.1$^{2,5}$.0]-dec-3-ene; and bicyclo[2.2.1]hept-2-ene derivatives having a cyclic substituent group, such as 5-cyclohexylbicyclo[2.2.1]hept-2-ene and 5-cyclopentylbicyclo[2.2.1]-hept-2-ene.

(b) Specific examples of the norbornene monomers having another unsaturated bond in addition to a carbon-carbon unsaturated bond participating in a polymerization reaction include bicyclo[2.2.1]hept-2-ene derivatives having an unsaturated bond outside its ring, such as 5-ethylidenebicyclo[2.2.1]hept-2-ene, 5-vinylbicyclo[2.2.1]-hept-2-ene and 5-propenylbicyclo[2.2.1]hept-2-ene; tetracyclo[4.4.1$^{2,5}$.1$^{7,10}$.0]-dodec-3-ene derivatives having an unsaturated bond outside its ring, such as 8-methylidenetetracyclo[4.4.1$^{2,5}$.1$^{7,10}$.0]-dodec-3-ene, 8-ethylidenetetracyclo[4.4.1$^{2,5}$.1$^{7,10}$.0]-dodec-3-ene, 8-vinyltetracyclo[4.4.1$^{2,5}$.1$^{7,10}$.0]-dodec-3-ene and 8-propenyltetracyclo[4.4.1$^{2,5}$.1$^{7,10}$.0]-dodec-3-ene; tricyclo[4.3.1$^{2,5}$.0]-dec-3,7-diene; and bicyclo[2.2.1]hept-2-ene derivatives having a cyclic substituent group with an unsaturated bond, such as 5-cyclohexenylbicyclo[2.2.1]hept-2-ene and 5-cyclopentenylbicyclo[2.2.1]hept-2-ene.

(c) Specific examples of the norbornene monomers having an aromatic ring include 5-phenylbicyclo[2.2.1]-hept-2-ene, tetracyclo[6.5.1$^{2,5}$.0$^{1,6}$.0$^{8,13}$]tridec-3,8,10,12-tetraene (i.e., 1,4-methano-1,4,4a,9a-tetrahydrofluorene) and tetracyclo[6.5.1$^{2,5}$.0$^{1,6}$.0$^{8,13}$]tetradec-3,8,10,12-tetraene (i.e., 1,4-methano-1,4,4a,5,10,10a-hexahydroanthracene).

(d) Specific examples of the norbornene monomers having a polar group include bicyclo[2.2.1]hept-2-ene derivatives having at least one substituent group containing an oxygen atom, such as 5-methoxycarbonylbicyclo[2.2.1]hept-2-ene, 5-ethoxycarbonylbicyclo-[2.2.1]hept-2-ene, 5-methyl-5-methoxycarbonylbicyclo-[2.2.1]hept-2-ene, 5-methyl-5-ethoxycarbonylbicyclo-[2.2.1]hept-2-ene, bicyclo[2.2.1]hept-5-enyl 2-methylpropionate, bicyclo[2.2.1]hept-5-enyl 2-methyloctanoate, bicyclo[2.2.1]hept-2-ene-5,6-dicarboxylic acid anhydride, 5-hydroxymethylbicyclo[2.2.1]hept-2-ene, 5,6-di(hydroxymethyl)bicyclo[2.2.1]hept-2-ene, 5-hydroxymethyl-isopropylbicyclo[2.2.1]hept-2-ene and 5,6-dicarboxybicyclo[2.2.1]hept-2-ene; tetracyclo[4.4.1$^{2,5}$.1$^{7,10}$.0]-dodec-3-ene derivatives having at least one substituent group containing an oxygen atom, such as 8-methoxycarbonyltetracyclo[4.4.1$^{2,5}$.1$^{7,10}$.0]-dodec-3-ene, 8-methyl-8-methoxycarbonyltetracyclo[4.4.1$^{2,5}$.1$^{7,10}$.0]-dodec-3-ene, 8-hydroxymethyltetracyclo[4.4.1$^{2,5}$.1$^{7,10}$.0]-dodec-3-ene and 8-carbonyltetracyclo[4.4.1$^{2,5}$.1$^{7,10}$.0]-dodec-3-ene; and bicyclo[2.2.1]hept-2-ene derivatives having at least one substituent group containing a nitrogen atom, such as 5-cyanobicyclo[2.2.1]hept-2-ene and bicyclo[2.2.1]hept-2-ene-5,6-dicarboxylic acid imide.

These norbornene monomers may be used either singly or in any combination thereof. In the case where it is intended to improve compatibility with thermosetting resins, it is preferred that a norbornene monomer having an aromatic ring or polar group be addition(co)polymerized in a proportion of 5 to 100 mol %.

As other monomers copolymerizable with the norbornene monomers, may be mentioned various kinds of vinyl compounds. Examples of the vinyl compounds include ethylenes or α-olefins having 2 to 20 carbon atoms, such as ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene and 1-eicosene; cycloolefins such as cyclobutene, cyclopentene, cyclohexene, 3,4-dimethylcyclopentene, 3-methylcyclohexene, 2-(2-methylbutyl)-1-cyclohexene, cyclooctene and 3a,5,6,7a-tetrahydro-4,7-methano-1H-indene; non-conjugated dienes such as 1,4-hexadiene, 4-methyl-1,4-hexadiene, 5-methyl-1,4-hexadiene and 1,7-octadiene; styrene and derivatives thereof such as styrene, α-methylstyrene, p-methylstyrene, p-chlorostyrene and vinylnaphthalene; conjugated dienes such as 1,3-butadiene and isoprene; and vinyl ethers such as ethyl vinyl ether and isobutyl vinyl ether. These vinyl compounds may be used either singly or in any combination thereof. For example, other compounds such as carbon monoxide may also be used as comonomers so far as they are copolymerizable with the norbornene monomers.

In the case where it is intended to improve compatibility with thermosetting resins, it is preferred that the norbornene monomer and styrene or a derivative thereof be addition-copolymerized.

It is preferred from the viewpoint of heat resistance that a proportion of a repeating unit derived from the norbornene monomer in the addition copolymer be controlled to preferably at least 40 mol %, more preferably at least 50 mol % based on the total repeating unit of the copolymer.

(2) Polymerization Process:

No particular limitation is imposed on the polymerization process of the norbornene monomer, or the norbornene monomer and the monomer copolymerizable therewith, and a hydrogenation process. The polymerization and hydrogenation may be conducted in accordance with any known processes.

The ring-opening polymerization of the norbornene monomer is conducted by using a ring-opening polymerization catalyst. As the ring-opening polymerization catalyst, may be used a catalyst system composed of a halide, nitrate or acetylacetone compound of a metal selected from among ruthenium, rhodium, palladium, osmium, iridium and platinum, and a reducing agent; a catalyst system composed of a halide or acetylacetone compound of a metal selected from among titanium, vanadium, zirconium, tungsten and molybdenum, and an organoaluminum compound; or the like.

A third component can be added to the above-described catalyst systems to improve polymerization activity and selectivity of ring-opening polymerization. Specific examples of the third component include molecular oxygen, alcohols, ethers, peroxides, carboxylic acids, acid anhydrides, acid chlorides, esters, ketones, nitrogen-containing compounds, sulfur-containing compounds, halogen-containing compounds, molecular iodine and other Lewis acids. As the nitrogen-containing compounds, are preferred aliphatic or aromatic tertiary amines. Specific examples thereof include triethylamine, dimethylaniline, tri-n-butylamine, pyridine and α-picoline.

The ring-opening polymerization may be conducted without using any solvent. However, the polymerization may be carried out in an inert organic solvent. Examples of the solvent include aromatic hydrocarbons such as benzene, toluene and xylene; aliphatic hydrocarbons such as n-pentane, hexane and heptane; alicyclic hydrocarbons such as cyclohexane; and halogenated hydrocarbons such as styrene dichloride, dichloroethane, dichloroethylene, tetrachloroethane, chlorobenzene, dichlorobenzene and trichlorobenzene.

The polymerization is conducted at a temperature of generally −50° C. to 100° C., preferably −30° C. to 80° C., more preferably −20° C. to 60° C. under pressure of generally 0 to 50 kg/cm², preferably 0 to 20 kg/cm².

As an example of the addition polymerization of the norbornene monomers, or the norbornene monomer and another monomer, may be mentioned a process comprising copolymerizing the monomer components in a hydrocarbon solvent or under conditions that no solvent is present, in the presence of a catalyst composed of a vanadium compound and an organoaluminum compound, preferably a halogen-containing organoaluminum compound, which are soluble in the solvent or the norbornene monomers. Examples of the hydrocarbon solvent include aliphatic hydrocarbon such as hexane, heptane, octane and kerosene; alicyclic hydrocarbons such as cyclohexane and methylcyclohexane; and aromatic hydrocarbons such as benzene, toluene and xylene.

The polymerization is conducted at a temperature of generally −50° C. to 100° C., preferably −30° C. to 80° C., more preferably −20° C. to 60° C. under pressure of generally 0 to 50 kg/cm², preferably 0 to 20 kg/cm².

(3) Hydrogenation:

A hydrogenated product (hydride) of a norbornene polymer can be obtained by hydrogenating a norbornene polymer having unsaturated bonds with molecular hydrogen in the presence of a hydrogenation catalyst in accordance with a method known per se in the art.

Examples of the hydrogenation catalyst include catalysts composed of a combination of a transition metal compound and an alkyl metal compound, for examples, combinations of cobalt acetate/triethylaluminum, nickel acetylacetonate/triisobutylaluminum, titanocene dichloride/n-butyllithium, zirconocene dichloride/sec-butyllithium, tetrabutoxytitanate/dimethylmagnesium, etc.

The hydrogenation reaction is generally carried out in an inert organic solvent. The organic solvent is preferably a hydrocarbon solvent because it has the excellent ability to dissolve a hydrogenated product formed therein. A cyclic hydrocarbon solvent is more preferred. Examples of such a hydrocarbon solvent include aromatic hydrocarbons such as benzene and toluene; aliphatic hydrocarbons such as n-pentane and hexane; alicyclic hydrocarbons such as cyclohexane and decalin; and ethers such as tetrahydrofuran and ethylene glycol dimethyl ether. At least two of these solvents may also be used in combination. The solvent may be generally the same as that used in the polymerization reaction, and so it is only necessity to add the hydrogenation catalyst to the polymerization reaction mixture as it is, so as to conduct the reaction.

The norbornene polymers used in the present invention preferably have high heat resistance and weather resistance. Therefore, it is preferred that generally at least 95%, preferably at least 98%, more preferably at least 99% of the unsaturated bonds in the main chain structures of the ring-opening polymers should be saturated. The unsaturated bonds in an aromatic ring structure may be hydrogenated. However, it is desirable from the viewpoint of heat resistance that generally at least 20%, preferably at least 30%, more preferably at least 40% of the unsaturated bonds in the aromatic ring structure should remain unhydrogenated. The unsaturated bonds in the main chain structure and the unsaturated bonds in the aromatic ring structure can be distinguishably identified by ¹H-NMR analysis. Even in the case of the addition polymer, it may also be hydrogenated, as needed, if it has unsaturated bonds in the side chains thereof In order to mainly hydrogenate the unsaturated bonds in the main chain structure, it is desirable that the hydrogenation reaction should be conducted at a temperature of generally −20° C. to 120° C., preferably 0 to 100° C., more preferably 20 to 80° C. under a hydrogen pressure of generally 0.1 to 50 kg/cm², preferably 0.5 to 30 kg/cm², more preferably 1 to 20 kg/cm².

(4) Norbornene polymer:

No particular limitation is imposed on the molecular weight of the thermoplastic norbornene polymer. However, the thermoplastic norbornene polymer generally has a molecular weight ranging from 500 to 500,000, preferably from 1,000 to 300,000, more preferably from 5,000 to 250,000, most preferably from 8,000 to 200,000 when expressed by a number average molecular weight (Mn) in terms of polystyrene as measured by gel permeation chromatography (GPC) using toluene as a solvent. The thermoplastic norbornene polymer the number average molecular weight (Mn) of which falls within this range is preferred because the mechanical strength and processability of the polymer are balanced with each other at a high level.

No particular limitation is imposed on the molecular weight distribution of the thermoplastic norbornene polymer. However, it is preferred that its ratio (Mw/Mn) of the weight average molecular weight (Mw) to the number average molecular weight (Mn) in terms of polystyrene as measured by GPC using toluene as a solvent be generally 4.0 or lower, preferably 3.0 or lower, more preferably 2.5 or lower, since the mechanical strength of the polymer is enhanced.

The glass transition temperature (Tg) of the thermoplastic norbornene polymer may be suitably selected as necessary for the end application intended. However, it is generally 50 to 400° C., preferably 100 to 350° C., more preferably 120 to 330° C. as measured by a differential scanning calorimeter (DSC). In fields of which particularly high heat resistance and soldering heat resistance are required, the glass transition temperature of the thermoplastic norbornene polymer is generally at least 160° C., preferably at least 180° C., more preferably at least 200° C., most preferably at least 250° C. The thermoplastic norbornene polymer preferably has a high glass transition temperature because deterioration of mechanical strength of the resulting composition in a region of high temperatures such as packaging temperature and reliability testing temperature is suppressed, and its viscosity characteristics also become excellent.

The thermoplastic norbornene polymers may be used either singly or in any combination thereof.

(5) Modification process:

The thus-obtained norbornene polymers and hydrogenated products thereof may be modified with an α,β-unsaturated carboxylic acid and/or a derivative thereof, styrenic hydrocarbon, organosilicon compound having an olefinically unsaturated bond and a hydrolyzable group, unsaturated epoxy compound, or the like in accordance with a process known by Japanese Patent Application Laid-Open No. 95235/1991 or the like. In the present invention, a modified norbornene polymer may be used as the thermoplastic norbornene polymer. Of the modified polymers, a polymer obtained by introducing a polar group into the norbornene polymer is particularly preferred from the viewpoints of compatibility with thermosetting resins and adhesion property to metals.

No particular limitation is imposed on the polar group so far as it is a polar group capable of improving the compatibility with thermosetting resins. Specific examples thereof include epoxy, carboxyl, hydroxyl, ester, silanol, amino, nitrile, halogen, acyl, sulfonic and carboxylic acid anhydride groups. Of these, the epoxy, carboxyl and carboxylic acid anhydride groups are preferred in order to improve the compatibility with epoxy resins which are the most common thermosetting resins.

Examples of a process for modifying the norbornene polymer to introduce a polar group thereinto include ① a process in which a polar group-containing unsaturated compound such as an unsaturated epoxy compound or unsaturated carboxylic compound is grafted into a norbornene polymer, and ② a process in which a modifying agent such as an epoxidizing agent is reacted with carbon-carbon unsaturated bonds present in a norbornene polymer In ① the graft-modifying process, a monomer having a polar group (graft monomer) is generally subjected to a graft reaction with a norbornene polymer. Typical examples of the graft monomer include unsaturated epoxy compounds and unsaturated carboxylic compounds.

Examples of the unsaturated epoxy compounds include glycidyl esters such as glycidyl acrylate, glycidyl methacrylate and glycidyl p-styrylcarboxylate; mono- or polyglycidyl esters of unsaturated polycarboxylic acids such as endo-cis-bicyclo[2,2,1]hept-5-ene-2,3-dicarboxylic acid and endo-cis-bicyclo[2,2,1]hept-5-ene-2-methyl-2,3-dicarboxylic acid; unsaturated glycidyl ethers such as allyl glycidyl ether, 2-methylallyl glycidyl ether, glycidyl ether of o-allylphenol, glycidyl ether of m-allylphenol and glycidyl ether of p-allylphenol; and 2-(o-vinylphenyl)ethylene oxide, 2-(p-vinylphenyl)ethylene oxide, 2-(o-allylphenyl)ethylene oxide, 2-(p-allylphenyl)ethylene oxide, 2-(o-vinylphenyl) propylene oxide, 2-(p-vinylphenyl) propylene oxide, 2-(o-allylphenyl)-propylene oxide, 2-(p-allylphenyl)propylene oxide, p-glycidylstyrene, 3,4-epoxy-1-butene, 3,4-epoxy-3-methyl-1-butene, 3,4-epoxy-1-pentene, 3,4-epoxy-3-methyl-1-pentene, 5,6-epoxy-1-hexene; vinylcyclohexene monoxide and allyl-2,3-epoxycyclopentyl ether. Of these, the allyl glycidyl esters and allyl glycidyl ethers are preferred, with the allyl glycidyl ethers being particularly preferred.

As the unsaturated carboxylic compounds, may be used unsaturated carboxylic acids or derivatives thereof. As examples of such unsaturated carboxylic acids, may be mentioned acrylic acid, maleic acid, fumaric acid, tetrahydrophthalic acid, itaconic acid, citraconic acid, crotonic acid, isocrotonic acid and nadic acid (endo-cis-bicyclo[2,2,1] hept-5-ene-2,3-dicarboxylic acid). As examples of derivatives of the above-described unsaturated carboxylic acids, may be mentioned unsaturated carboxylic acid anhydrides, unsaturated carboxylic acid halides, unsaturated carboxylic acid amides, unsaturated carboxylic acid imides and ester compounds of unsaturated carboxylic acids. As specific examples of such derivatives, may be mentioned malenyl chloride, maleimide, maleic anhydride, citraconic anhydride, monomethyl maleate, dimethyl maleate and glycidyl maleate. Of these, the unsaturated dicarboxylic acids or acid anhydrides thereof are preferred, with maleic acid and nadic acid or acid anhydrides thereof being particularly preferred.

These graft monomers may be used either singly or in any combination thereof.

The modified norbornene polymers can be produced by subjecting such a graft monomer as described above and the norbornene polymer to graft modification by using any of various processes. Examples of the processes include (1) a process comprising melting a norbornene polymer and adding a graft monomer to the melt to graft polymerize them, and (2) a process comprising dissolving a norbornene polymer in a solvent and adding a graft monomer to the solution to graft copolymerize them.

In order to efficiently graft copolymerize the graft monomer, it is generally preferred to carry out a reaction in the presence of a radical initiator. Examples of the radical initiator include organic peroxides, organic peresters and azo compounds. Of these, benzoyl peroxide, and dialkyl peroxides such as dicumyl peroxide, di-tert-butyl peroxide, 2,5-dimethyl-2,5-di(tert-butyl peroxy)-hexyne-3, 2,5-dimethyl-2,5-di(tert-butyl peroxy)hexane and 1,4-bis(tert-butyl peroxyisopropyl)benzene are preferably used as the radical initiators. A proportion of the radical initiator used is generally within a range of 0.001 to 10 parts by weight, preferably 0.001 to 5 parts by weight, more preferably 0.1 to 2.5 parts by weight per 100 parts by weight of the unmodified norbornene polymer.

No particular limitation is imposed on the graft-modifying reaction, and the reaction may be carried out in accordance with a method known per se in the art. The reaction is conducted at a temperature of generally 0° C. to 400° C., preferably 60° C. to 350° C. The reaction time is generally within a range of 1 minute to 24 hours, preferably 30 minutes to 10 hours.

In ② the process of reacting a modifying agent, the modifying agent such as an epoxidizing agent is reacted with a norbornene polymer having carbon-carbon unsaturated bonds in its main chain or side chain to introduce a polar group into the polymer.

As the norbornene polymer, there is used a ring-opening polymer of a norbornene monomer, a partially hydrogenated product of the ring-opening polymer, an addition (co) polymer of a norbornene monomer having a carbon-carbon unsaturated bond such as an alkylidene group in its side chain, or the like.

When for example, a peroxide is used as the modifying agent, the carbon-carbon double bonds in the main chain or side chain of the norbornene polymer can be epoxidized. Examples of the peroxide include peracids such as peracetic acid, perbenzoic acid, m-chloroperbenzoic acid and trifluoroperacetic acid: and hydroperoxides such as hydrogen peroxide, tert-butyl hydroperoxide and cumene hydroperoxide.

For the epoxidation reaction, it is only necessary to mix the norbornene polymer and the peroxide and heat the mixture. The reaction is generally conducted in the presence of a solvent. No particular limitation is imposed on the solvent so far as it can dissolve or disperses the norbornene polymer therein. Examples of usable solvents include the same solvents as those mentioned in the production process of the norbornene polymer. The amount of the solvent used is within a range of 1 to 100 times, preferably 2 to 80 times, more preferably 5 to 50 times in terms of a weight ratio to the norbornene polymer.

Conditions for the reaction may be suitably selected according to the kind of the peroxide used. However, the reaction is generally conducted at a temperature of 0 to 300° C., preferably 50 to 200° C. The reaction time is generally within a range of 0.1 to 10 hours, preferably 0.5 to 5 hours. After completion of the reaction, a poor solvent such as methanol is added in a great amount to the reaction system to deposit a polymer formed, and the polymer is collected by filtration, washed and then dried under reduced pressure, whereby an epoxy-modified polymer can be obtained.

In order to obtain a hydroxy-modified norbornene polymer, there is mentioned, for example, a process comprising reacting formic acid and hydrogen peroxide with a norbornene polymer having carbon-carbon unsaturated bonds and then neutralizing the reaction mixture with an alkali (for example, sodium hydroxide).

The rate (degree) of modification of the modified norbornene polymer is suitably selected as necessary for the end application intended. However, it is generally within a range of 0.1 to 100 mol %, preferably 1 to 50 mol %, more preferably 5 to 30 mol % based on the total number of monomer units in the polymer. The modified norbornene polymer the rate of modification of which falls within this range is preferred in that the compatibility with thermosetting resins and adhesion property to metals are improved without deteriorating its electrical properties such as dielectric constant.

The rate of modification is represented by the following equation (1):

$$\text{Rate of modification (mol \%)} = (X/Y) \times 100 \quad (1)$$

Wherein
X: the total number of moles of the polar group (determined by $^1$H-NMR); and
Y: the total number of monomer units in the polymer (weight average molecular weight of the polymer/average molecular weight of the monomer).

A polymer having a long-chain substituent group in its repeating structural unit is preferred in that its viscosity when dissolved in a solvent is low, and so the thermosetting resin is uniformly dispersed therein with ease. Examples of the polymer having a long-chain substituent group in its repeating structural unit include ① addition (co)polymers of a norbornene monomer having a substituent group having at least 4 carbon atoms, such as 2-butylnorbornene, 2-hexylnorbornene or 5-butoxycarbonyl-2-norbornene, and ② norbornene polymers with a vinyl compound having at least 4 carbon atoms, such as 1-dodecene, 1-hexadecene, allyl ethyl ether, butyl acrylate or styrene, added thereto by a graft reaction. However, such polymers are not limited to these (co)polymers.

Thermosetting Resin:

No particular limitation is imposed on the thermosetting resin useful in the practice of the present invention, and those commonly used in the resin industry may be used. Examples thereof include epoxy resins, urea resins, melamine resins, phenol resins, polyimide resins and unsaturated polyester resins. Of these, the epoxy resins and polyimide resin are preferred.

Many of the thermosetting resins are composed of a low-molecular weight raw material and a hardener. In the case of, for example, an epoxy resin, the resin is composed of an epoxy compound and various kinds of hardeners. No particular limitation is imposed on the epoxy compound so far as it has an epoxy group in its molecule. Examples thereof include compounds used in epoxy resins of the bisphenol, novolak, alicyclic, heterocyclic, glycerol and dicyclopentadiene types. Of these, halogenated bisphenol type epoxy compounds represented by the formula (E1):

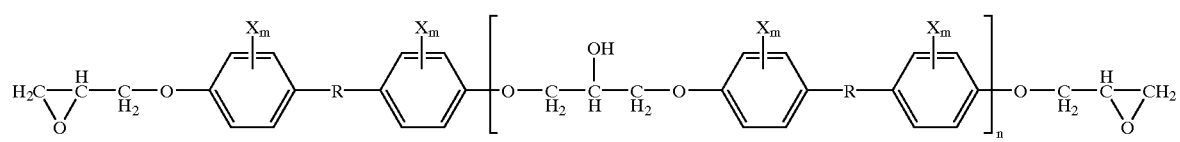

(E1)

wherein X is a halogen atom, R is a divalent hydrocarbon group, m is an integer of 1 to 3, and n is 0 or an integer of at least 1, are preferred.

In the epoxy compounds of the formula (E1), a compound in which m is all 2, n is substantially 0, the halogen atom X is a bromine atom, and R is an isopropylidene group is preferred.

Novolak type epoxy compounds represented by the formula (E2):

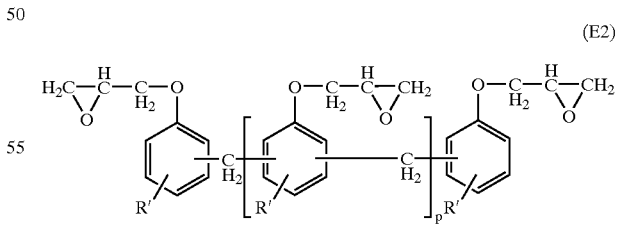

(E2)

wherein R' is a hydrogen atom or alkyl group having 1 to 20 carbon atoms, and p is 0 or an integer of at least 1, are also preferably used.

In the epoxy compounds of the formula (E2), compounds in which an average value of p is 0 to 5, and R' is a hydrogen atom or methyl group are preferred.

These epoxy compounds may be used either singly or in any combination thereof. When great importance is attached to flame retardancy, the bisphenol type epoxy compounds of the formula (E1) are preferred. When the heat resistance and chemical resistance are intended to be improved, the novolak type epoxy compounds of the formula (E2) are preferred. As specific examples of the bisphenol type epoxy compounds of the formula (E1), may be mentioned compounds represented by the formula (E3).

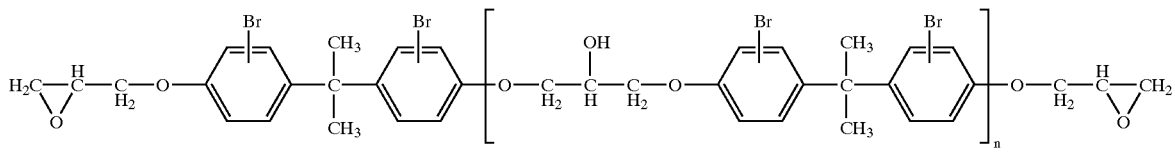

(E3)

As the halogenated bisphenol type epoxy compounds represented by the formula (E3), for example, those having Br contents of 20 wt. % and 50 wt. %, respectively, are commercially available.

As the hardener for the epoxy resins, there may be used publicly known compounds, for example, amine compounds, imidazole compounds, nitrogen-containing heterocyclic compounds such as diazabicycloundecene, organic phosphines, organic boron complexes, quaternary ammonium compounds and quaternary phosphonium compounds.

Examples of the polyimide resins include addition type aromatic polyimides such as nadic acid-terminated polyimide and acetylene-terminated polyimide; and bismaleimide type polyimides such as polyamino-bismaleimide (PI) resins, modified imide resins obtained by adding an epoxy compound, allyl compound, acrylic compound, vinyl compound or the like to PI, and bismaleimide.triazine (BT) resins.

These thermosetting resins may be used either singly or in any combination thereof. The amount of the thermosetting resin blended is generally 1 to 150 parts by weight, preferably 5 to 120 parts by weight, particularly preferably 10 to 100 parts by weight per 100 parts by weight of the thermoplastic norbornene polymer. If the amount of the thermosetting resin blended is extremely small, the resulting composition becomes poor in adhesion property to metals. If the amount is extremely great on the other hand, the resulting composition becomes poor in electrical properties such as dielectric constant and dielectric loss tangent. It is hence not preferable to blend the thermosetting resin in such a small or great amount.

Norbornene Polymer Composition:

In the norbornene polymer composition according to the present invention, as needed, a crosslinking agent, a crosslinking aid, a filler, a flame retardant, other compounding additives, a solvent, etc. may be blended in addition to the above-described components.

(1) Crosslinking Agent:

In order to crosslink the thermoplastic norbornene polymer composition according to the present invention, for example, a method of crosslinking the composition by irradiation of radiation is also included. However, a method of crosslinking the composition by blending a crosslinking agent is generally adopted. No particular limitation is imposed on the crosslinking agent. However, ① an organic peroxide, ② a crosslinking agent of the type that its effect is exhibited by heat, ③ a crosslinking agent of the type that its effect is exhibited by light, or the like is used.

① Organic Peroxide:

Examples of the organic peroxide include ketone peroxides such as methyl ethyl ketone peroxide and cyclohexanone peroxide; peroxyketals such as 1,1-bis(t-butyl peroxy)-3,3,5-trimethylcyclohexane and 2,2-bis(t-butyl peroxy)butane; hydroperoxides such as t-butyl hydroperoxide and 2,5-dimethylhexane-2,5-dihydroperoxide; dialkyl peroxides such as dicumyl peroxide, 2,5-dimethyl-2,5-di(t-butyl peroxy)hexyne-3 and α,α'-bis(t-butyl peroxy-m-isopropyl)benzene; diacyl peroxides such as octanoyl peroxide and isobutyryl peroxide; and peroxyesters such as peroxydicarbonate. Of these, the dialkyl peroxides are preferred from the viewpoint of performance of the crosslinked resin. It is preferred to change the kind of the alkyl group according to the forming or molding temperature.

The organic peroxides may be used either singly or in any combination thereof. The amount of the organic peroxide blended is generally 0.001 to 30 parts by weight, preferably 0.01 to 25 parts by weight, more preferably 1 to 20 parts by weight per 100 parts by weight of the thermoplastic norbornene polymer. The blending amount within this range is preferred because crosslinkability of the resulting composition, and properties of the crosslinked resin, such as electrical properties, chemical resistance and water resistance are balanced with one another at a high level.

② Crosslinking Agent Capable of Exhibiting its Effect by Heat:

No particular limitation is imposed on the crosslinking agent (hardener) capable of exhibiting its effect by heat so far as it can cause a crosslinking reaction by heating. Examples thereof include aliphatic polyamines such as diamines, triamines and still higher polyamines, alicyclic polyamines, aromatic polyamines, bisazides, acid anhydrides, dicarboxylic acids, diols, polyhydric phenols, polyamides, diisocyanates, and polyisocyanates. Specific examples thereof include aliphatic polyamines such as hexamethylenediamine, triethylenetetramine, diethylenetriamine and tetraethylenepentamine; alicyclic polyamines such as diaminocyclohexane, 3(4),8(9)-bis(aminomethyl)tricyclo-[5,2,1,0$^{2,6}$]decane, 1,3-(diaminomethyl)cyclohexane, menthenediamine, isophoronediamine, N-aminoethylpiperazine, bis(4-amino-3-methylcyclohexyl)methane and bis(4-amino-cyclohexyl)methane; aromatic polyamines such as 4,4'-diaminodiphenyl ether, 4,4'-diaminodiphenylmethane, α,α'-bis(4-aminophenyl)-1,3-diisopropylbenzene, α,α'-bis(4-aminophenyl)-1,4-diisopropylbenzene, 4,4'-diaminodiphenyl sulfone and m-phenylenediamine; bisazides such as 4,4'-bisazidobenzal(4-methyl)cyclohexanone, 4,4'-diazidochalcone, 2,6-bis(4'- azidobenzal)cyclohexanone, 2,6-bis-(4'-azidobenzal)-4-methylcyclohexanone, 4,4'-diazidodiphenyl sulfone, 4,4'-diazidodiphenylmethane and 2,2'-diazidostilbene; acid anhydrides such as phthalic anhydride, pyromellitic anhydride, benzophenone-tetracarboxylic acid anhydride, nadic anhydride, 1,2-cyclohexanedicarboxylic acid anhydride, maleic anhydride-modified polypropylene and maleic anhydride-modified norbornene resins; dicarboxylic acids such as fumaric acid, phthalic acid, maleic acid, trimellitic acid and himic acid; diols such as 1,3'-butanediol, 1,4'-butanediol, hydroquinone-dihydroxydiethyl ether and tricyclodecanedimethanol; triols such as 1,1,1-trimethylolpropane; polyhydric phenols such as phenol novolak resins and cresol novolak resin; polyhydric alcohols such as tricyclodecanediol, diphenylsilanediol, ethylene glycol and derivatives thereof, diethylene glycol and derivatives thereof, and triethylene glycol and derivatives thereof; polyamides such as nylon 6, nylon 66, nylon 610, nylon 11, nylon 612, nylon 12, nylon 46, methoxymethylated polyamides, polyhexamethylenediamine terephthalamide and polyhexamethylene isophthalamide; diisocyanates such as hexamethylene diisocyanate and toluylene diisocyanate; polyisocyanates such as dimers and trimers of diisocyanates, and adducts of diisocyanates with a diol or triol; and blocked isocyanates the isocyanate moiety of which is protected by a blocking agent.

These crosslinking agents may be used either singly or in any combination thereof. Of these, the aromatic polyamines, acid anhydrides, polyhydric phenols and polyhydric alcohols are preferred for reasons of providing a crosslinked resin excellent in heat resistance, mechanical strength, adhesion property and dielectric properties (low dielectric constant and dielectric loss tangent). Among others, 4,4-diaminodiphenylmethane (aromatic polyamine), maleic anhydride-modified norbornene resins (acid anhydride) and polyhydric alcohols are particularly preferred.

No particular limitation is imposed on the amount of the crosslinking agent blended. From the viewpoints of being able to efficiently conduct the crosslinking reaction and improve the physical properties of the resulting crosslinked resin, and being profitable, however, it is generally within a range of 0.001 to 30 parts by weight, preferably 0.01 to 25 parts by weight, more preferably 1 to 20 parts by weight per 100 parts by weight of the thermoplastic norbornene polymer. If the amount of the crosslinking agent is too small, the resulting composition becomes hard to undergo crosslinking, and so sufficient heat resistance and solvent resistance cannot be imparted to the composition. On the contrary, any amount too great results in a crosslinked resin lowered in properties such as water-absorption property and dielectric properties. It is hence not preferable to use the crosslinking agent in any amount outside the above range. Therefore, the blending amount within this range is preferred because these properties are balanced with one another at a high level.

As needed, a crosslinking accelerator (hardening accelerator) may also be blended to enhance the efficiency of the crosslinking reaction.

As examples of the hardening accelerator, may be mentioned amines such as pyridine, benzyldimethylamine, triethanolamine, triethylamine, tributylamine, tribenzylamine, dimethylformamide and imidazoles. The hardening accelerator is added in order to regulate the rate of the crosslinking reaction and further enhance the efficiency of the crosslinking reaction. No particular limitation is imposed on the amount of the hardening accelerator blended. However, it is used within a range of generally 0.1 to 30 parts by weight, preferably 1 to 20 parts by weight per 100 parts by weight of the thermoplastic norbornene polymer. The blending amount within this range is preferred because crosslinking density, dielectric properties, water absorption and the like of the crosslinked resin are balanced with one another at a high level. Among others, imidazoles are preferred in that a crosslinked resin excellent in dielectric properties can be provided.

③ Crosslinking Agent Capable of Exhibiting its Effect by Light:

No particular limitation is imposed on the crosslinking agent (hardener) capable of exhibiting its effect by light so far as it is a photoreactive substance which reacts with the thermoplastic norbornene polymer by irradiation of actinic rays such as ultraviolet rays such as g rays, h rays or i rays, far ultraviolet rays, X rays, or electron rays to form a crosslinked compound. Examples thereof include aromatic bisazide compounds, photo-induced amine generators and photo-induced acid generators.

Specific typical examples of the aromatic bisazide compounds include 4,4'-diazidochalcone, 2,6-bis(4'-azidobenzal)cyclohexanone, 2,6-bis(4'-azidobenzal)-4-methylcyclohexanone, 4,4'-diazidodiphenyl sulfone, 4,4'-diazidobenzophenone, 4,4'-diazidophenyl, 2,7-diazidofluorene and 4,4'-diazidophenylmethane. These compounds may be used either singly or in any combination thereof.

Specific examples of the photo-induced amine generators include o-nitrobenzyloxycarbonylcarbamates, 2,6-dinitrobenzyloxycarbonylcarbamates and $\alpha,\alpha$-dimethyl-3,5-dimethoxybenzyloxycarbonylcarbamates of aromatic amines or aliphatic amines. More specifically, there may be mentioned o-nitrobenzyloxycarbonylcarbamates of aniline, cyclohexylamine, piperidine, hexamethylenediamine, triethylenetetramine, 1,3-(diaminomethyl)cyclohexane, 4,4'-diaminodiphenyl ether, 4,4'-diaminodiphenylmethane, phenylenediamine and the like. These compounds may be used either singly or in any combination thereof.

The photo-induced acid generator is a substance which forms a Brønsted acid or Lewis acid upon exposure to actinic rays. Examples thereof include onium salts, halogenated organic compounds, quinonediazide compounds, $\alpha,\alpha$-bis(sulfonyl)diazomethane compounds, $\alpha$-carbonyl-$\alpha$-sulfonyl-diazomethane compounds, sulfone compounds, organic acid ester compounds, organic acid amide compounds and organic acid imide compounds. These compounds, which cleave upon exposure to the actinic rays to form an acid, may be used either singly or in any combination thereof.

No particular limitation is imposed on the amount of these photoreactive compounds blended. From the viewpoints of being able to efficiently conduct the reaction with the thermoplastic norbornene polymer, not impairing the physical properties of the resulting crosslinked resin, and being profitable, however, it is generally within a range of 0.001 to 30 parts by weight, preferably 0.01 to 25 parts by weight, more preferably 1 to 20 parts by weight per 100 parts by weight of the thermoplastic norbornene polymer. If the amount of the photoreactive substance added is too small, the resulting composition becomes hard to undergo crosslinking, and so sufficient heat resistance and solvent resistance cannot be imparted to the composition. On the contrary, any amount too great results in a crosslinked resin lowered in properties such as water-absorption property and dielectric properties. It is hence not preferable to use the photoreactive compound in any amount outside the above range. Therefore, the blending amount within this range is preferred because these properties are balanced with one another at a high level.

(2) Crosslinking Aid:

In the present invention, it is preferred to use a crosslinking aid (hardening aid), because the crosslinkability and the dispersibility of the compounding additives can be more enhanced.

No particular limitation is imposed on the crosslinking aid used in the present invention. Publicly known compounds disclosed in Japanese Patent Application Laid-Open No. 34924/1987 and the like may be used. Examples thereof include oxime.nitroso type crosslinking aids such as quinone dioxime, benzoquinone dioxime and p-nitrosophenol; maleimide type crosslinking aids such as N,N-m-phenylenebismaleimide; allyl type crosslinking aids such as diallyl phthalate, triallyl cyanurate and triallyl isocyanurate; methacrylate type crosslinking aids such as ethylene glycol dimethacrylate and trimethylolpropane trimethacrylate; vinyl type crosslinking aids such as vinyltoluene, ethylvinylbenzene and divinylbenzene. Of these, the allyl type crosslinking aids and methacrylate type crosslinking aids are preferred because they make it easy to uniformly disperse compounding additives.

The amount of the crosslinking aid added is suitably selected according to the kind of the crosslinking agent used. However, it is generally 0.1 to 10 parts by weight, preferably 0.2 to 5 parts by weight per part by weight of the crosslinking agent. If the amount of the crosslinking aid added is too small, the resulting composition becomes hard to undergo crosslinking. On the contrary, any amount too great results in a crosslinked resin having a possibility that its electrical properties, water resistance, moisture resistance and the like may be deteriorated.

(3) Filler:

In order to improve mechanical strength (toughness) and reduce coefficient of linear expansion in particular, a filler may be blended into the composition according to the present invention. Examples of the filler include inorganic and organic fillers.

No particular limitation is imposed on the inorganic fillers. Examples thereof include calcium carbonate (precipitated calcium carbonate, heavy or pulverized calcium, special calcium type fillers), clay (aluminum silicate; fine nepheline syenite powder, calcined clay, silane-modified clay), talc, silica, alumina, diatomaceous earth, quartz sand, pumice powder, pumice balloons, slate powder, mica powder, asbestos, alumina colloid (alumina sol), alumina white, aluminum sulfate, barium sulfate, lithopone, calcium sulfate, molybdenum disulfide, graphite, glass fibers, glass beads, glass flake, foamed glass beads, fly ash beads, volcanic glass balloons, synthetic fiber balloons, monocrystalline potassium titanate, carbon fibers, carbon balloons, anthracite culm, artificial cryolite, titanium oxide, magnesium oxide, basic magnesium carbonate, dolomite, potassium titanate, mica, asbestos, calcium silicate, montmorillonite, bentonite, graphite, aluminum powder, molybdenum sulfide, boron fibers and silicon carbide fibers.

Examples of the organic fillers include polyethylene fibers, polypropylene fibers, polyester fibers, polyamide fibers, fluorocarbon fibers, ebonite powder, thermosetting resin balloons, sarab balloons, shellac, wood flour, cork powder, polyvinyl alcohol fibers, cellulose powder and wood pulp.

(4) Flame Retardant:

The flame retardant is not an essential component. However, it is preferred that the flame retardant be added to the thermoplastic norbornene polymer composition when the composition is used for electronic parts. No particular limitation is imposed on the flame retardant. However, those which undergo none of decomposition, denaturation and deterioration by the crosslinking agent (hardener) are preferred.

Various kinds of chlorine- or bromine-containing flame retardants may be used as the halogen-containing flame retardants. From the viewpoints of flameproofing effect, heat resistance upon forming or molding, dispersibility in resins and influence on the physical properties of the resins, however, the following flame retardants may be preferably used. Namely, preferable examples thereof include hexabromobenzene, pentabromoethylbenzene, hexabromobiphenyl, decabromodiphenyl, hexabromodiphenyl oxide, octabromodiphenyl oxide, decabromodiphenyl oxide, pentabromocyclohexane, tetrabromobisphenol A and derivatives thereof [for example, tetrabromobisphenol A-bis (hydroxyethyl ether), tetrabromobisphenol A-bis(2,3-dibromopropyl ether), tetrabromobisphenol A-bis (bromoethyl ether), tetrabromobisphenol A-bis(allyl ether), etc.], tetrabromobisphenol S and derivative thereof [for example, tetrabromobisphenol S-bis(hydroxyethyl ether), tetrabromobisphenol S-bis(2,3-dibromopropyl ether), etc.], tetrabromophthalic anhydride and derivatives thereof [for example, tetrabromophthalimide, ethylenebistetrabromophthalimide, etc.], ethylene-bis(5,6-dibromonorbornene-2,3-dicarboxyimide), tris-(2,3-dibromopropyl-1) isocyanurate, adducts of hexabromocyclopentadiene by Diels-Alder reaction, tribromophenyl glycidyl ether, tribromophenyl acrylate, ethylenebistribromophenyl ether, ethylenebispentabromophenyl ether, tetradecabromodiphenoxybenzene, brominated polystyrene, brominated polyphenylene oxide, brominated epoxy resins, brominated polycarbonate, polypentabromobenzyl acrylate, octabromonaphthalene, hexabromocyclododecane, bis(tribromophenyl)fumaramide and N-methylhexabromodiphenylamine. Incidentally, the halogenated bisphenol type epoxy compounds in the thermosetting resin mentioned above are also a kind of flame retardant.

The amount of the flame retardant added is generally 1 to 150 parts by weight, preferably 10 to 140 parts by weight, particularly preferably 15 to 120 parts by weight per 100 parts by weight of the thermoplastic norbornene polymer.

As a flame retardant auxiliary for causing the flame retardant to more effectively exhibit its flameproofing effect, for example, an antimonial flame retardant auxiliary such as antimony trioxide, antimony pentoxide, sodium antimonate or antimony trichloride may be used. These flame retardant auxiliaries are used in a proportion of generally 1 to 30 parts by weight, preferably 2 to 20 parts by weight per 100 parts by weight of the flame retardant.

(5) Other Polymer Components:

In the present invention, rubbery polymers and other thermoplastic resins may be blended into the thermoplastic norbornene polymer composition, as needed, in order to impart flexibility and the like to the composition.

The rubbery polymers are polymers having a glass transition temperature of ordinary temperature (25° C.) or lower and include general rubber-like polymers and thermoplastic elastomers. The Mooney viscosity ($ML_{1+4}$, 100° C.) of such a rubbery polymer is suitably selected as necessary for the end application intended and is generally 5 to 200.

Examples of the rubber-like polymers include ethylene-α-olefin type rubbery polymers; ethylene-α-olefin-polyene terpolymer rubbers; copolymers of ethylene and an unsaturated carboxylic acid ester, such as ethylene-methyl methacrylate and ethylene-butyl acrylate; copolymers of ethylene and a fatty acid vinyl ester, such as ethylene-vinyl acetate; polymers of acrylic acid alkyl esters such as ethyl acrylate, butyl acrylate, hexyl acrylate, 2-ethylhexyl acrylate and lauryl acrylate; diene rubbers such as polybutadiene, polyisoprene, styrene-butadiene or styrene-isoprene random copolymers, acrylonitrile-butadiene copolymers, butadiene-isoprene copolymers, butadiene-alkyl (meth)acrylate copolymers, butadiene-alkyl (meth)acrylate-acrylonitrile terpolymers and butadiene-alkyl (meth)acrylate-acrylonitrile-styrene tetrapolymers; and butylene-isoprene copolymers.

Examples of the thermoplastic elastomers include aromatic vinyl-conjugated diene block copolymers such as styrene-butadiene block polymers, hydrogenated styrene-butadiene block copolymers, styrene-isoprene block copolymers and hydrogenated styrene-isoprene block copolymers, low crystalline polybutadiene resins, ethylene-propylene elastomers, styrene-grafted ethylene-propylene elastomers, thermoplastic polyester elastomers, and ethylenic ionomer resins. Of these thermoplastic elastomers, the hydrogenated styrene-butadiene block copolymers and hydrogenated styrene-isoprene block copolymers are preferred. As specific examples thereof, may be mentioned those described in Japanese Patent Application Laid-Open Nos. 133406/1990, 305814/1990, 72512/1991 and 74409/1991, etc.

Examples of the other thermoplastic resins include low density polyethylene, high density polyethylene, linear low density polyethylene, very low density polyethylene, ethylene-ethyl acrylate copolymers, ethylene-vinyl acetate copolymers, polystyrene, poly(phenylene sulfide), poly(phenylene ether), polyamide, polyester, polycarbonate and cellulose triacetate.

These rubbery polymers and other thermoplastic resins may be used either singly or in any combination thereof. The blending amount thereof is suitably selected within limits not impeding the objects of the present invention. However, it is preferably 30 parts by weight or less in order not to impair properties as an insulating material.

(6) Other Compounding Additives:

To the thermoplastic norbornene polymer compositions according to the present invention, may be added proper amounts of other compounding additives such as heat stabilizers, weathering stabilizers, leveling agents, antistatic agents, slip agents, antiblocking agents, anti-fogging agents, lubricants, dyes, pigments, natural oil, synthetic oil and wax, as needed.

Specific examples thereof include phenolic antioxidants such as tetrakis[methylene-3(3,5-di-t-butyl-4-hydroxyphenyl) propionate]methane, alkyl β-(3,5-di-t-butyl-4-hydroxyphenyl)propionates and 2,2'-oxamido-bis [ethyl-3(3,5-di-t-butyl-4-hydroxyphenyl) propionate]; phosphoric stabilizers such as trisnonylphenyl phosphate, tris(2,4-di-t-butylphenyl) phosphite and tris(2,4-di-t-butylphenyl) phosphate; fatty acid metal salts such as zinc stearate, calcium stearate and calcium 12-hydroxy-stearate; polyhydric alcohol fatty acid esters such as glycerol monostearate, glycerol monolaurate, glycerol distearate, pentaerythritol monostearate, pentaerythritol distearate and pentaerythritol tristearate; synthetic hydrotalcite; amine type antistatic agents; leveling agents for paints, such as fluorine-containing nonionic surfactants, special acrylic resin type leveling agents and silicone type leveling agents; coupling agents such as silane coupling agents, titanate coupling agents, aluminum type coupling agents and zircoaluminate coupling agents; plasticizers; and colorants such as pigments and dyes.

These compounding additives may be used either singly or in any combination thereof. The compounding amounts thereof are suitably selected according to their respective functions and the end application intended.

(7) Solvent:

In the present invention, the norbornene polymer composition may be dissolved in a solvent to prepare an impregnating solution for prepregs, produce a sheet by a solution casting method, or form a film by a coating method.

Examples of a solvent used in dissolving the norbornene polymer composition include aromatic hydrocarbons such as, toluene, xylene and ethylbenzene; aliphatic hydrocarbons such as n-pentane, hexane and heptane; alicyclic hydrocarbons such as cyclohexane; and halogenated hydrocarbons such as chlorobenzene, dichlorobenzene and trichlorobenzene. The solvent is used in an amount sufficient to uniformly dissolve or disperse the thermoplastic norbornene polymer and the individual components optionally blended therein.

Molding, Prepreg, Laminate, etc.:

In the present invention, the norbornene polymer composition may be molded and then crosslinked to form a crosslinked molding. The thermoplastic norbornene polymer composition is molded after dissolving it in a solvent so as not to cause deterioration of moldability due to crosslinking in the course of molding, or by melting it at a temperature at which it undergoes no crosslinking, or crosslinking proceeds only at a sufficiently low rate. Specifically, the norbornene polymer composition dissolved in a solvent is cast, and the solvent is removed to form a sheet, or a base material is impregnated with the composition dissolved in the solvent to conduct molding.

The norbornene polymer composition according to the present invention can be molded into various parts.

Examples of a molding process in this case include ① a process in which the composition is processed into a molding in a state of a thermoplastic resin by injection molding, press molding, compression molding or the like, ② a process in which a solution with the composition dissolved in an organic solvent is processed into a molding by potting or cast molding while removing the solvent, and ③ a process in which the composition is processed into a thermoset molding by transfer molding or the like.

(1) Prepreg:

A prepreg is produced by uniformly dissolving or dispersing the thermoplastic norbornene polymer, thermosetting resin and various compounding additives in a solvent such as toluene, cyclohexane or xylene, impregnating a reinforcing base material with the solution or dispersion and then removing the solvent. In general, the prepreg is preferably produced so as to give a thickness of about 50 to 500 µm.

The amount of the solvent used is controlled in such a manner that a solids concentration amounts to generally 1 to 90 wt. %, preferably 5 to 85 wt. %, more preferably 10 to 80 wt. %.

Examples of usable reinforcing base materials include paper base materials (linter paper, kraft paper, etc.), glass base materials (glass cloth, glass mat, glass paper, quartz fibers, etc.) and synthetic resin fiber base materials (polyester fibers, Alamide fibers, etc.). These reinforcing base materials may be surface treated with a treating agent such as a silane coupling agent. These reinforcing base materials may be used either singly or in any combination thereof.

The amount of the thermoplastic norbornene polymer composition to the reinforcing base material is suitably selected as necessary for the end application intended. It is however 1 to 90 wt. %, preferably 10 to 60 wt. % based on the reinforcing base material.

(2) Sheet:

No particular limitation is imposed on a process for producing a sheet. However, a casting process is generally used. For example, the norbornene polymer composition according to the present invention is dissolved or dispersed in a solvent such as toluene, xylene or cyclohexane so as to give a solids concentration of about 5 to 50 wt. %, the solution or dispersion is cast or coated on a smooth surface, the solvent is removed by drying or the like, and the dried product is separated from the smooth surface to obtain a sheet. When the solvent is removed by drying, it is preferred to select a method by which foaming by rapid drying does not occur. For example, it is only necessary to volatilize the solvent to a certain extent at a low temperature and then raise the temperature so as to sufficiently volatilize the solvent.

As the smooth surface, may be used a planished metal plate, a carrier film made of a resin, or the like. When the resin-made carrier film is used, a solvent to be used and drying conditions are determined taking the solvent resistance and heat resistance of a material of the carrier film into consideration.

Sheets obtained by the casting process generally have a thickness of about 10 µm to 1 mm. These sheets can be used as interlayer insulating films, films for forming moistureproof layers, etc. by crosslinking them. They may also be used in the production of laminates which will be described subsequently.

(3) Laminate:

A laminate is obtained by stacking a plurality of the above-described prepregs and/or uncrosslinked sheets on one another and hot-pressing them, thereby crosslinking and mutually fusion-bonding them into a necessary thickness. When a laminated sheet is used as a circuit board, a circuit is formed by, for example, laminating an electrically conductive layer for wiring composed of a metal foil or the like, or etching the surface. The electrically conductive layer for wiring may be laminated not only on the outer surface of a laminated sheet as a finished article, but also in the interior of the laminated sheet according to the purpose. In order to prevent warpage upon a secondary processing such as etching, it is preferred to laminate laminating materials so as to vertically symmetrize. For example, the surfaces of the stacked prepregs and/or sheets are heated to a fusion-bonding temperature according to the norbornene resin used or higher, generally about 150 to 300° C., and they are pressed under a pressure of about 30 to 80 kgf/cm$^2$, thereby crosslinking and mutually fusion-bonding the respective layers to obtain a laminated sheet.

Other methods for applying a metal to these insulating layers include vapor deposition, electroplating, sputtering, ion plating, spraying and layering. Examples of metals commonly used include copper, nickel, tin, silver, gold, aluminum, platinum, titanium, zinc and chromium. Copper is oftenest used in circuit boards.

(4) Crosslinking:

In the present invention, a molding is crosslinked by itself or in the form of a laminate to obtain a crosslinked molding. The crosslinking may be conducted in accordance with a method known per se in the art. Examples thereof include a method of irradiating a molding with radiation, a method of heating a molding to a certain temperature or higher in the case where an organic peroxide has been blended, and a method of irradiating a molding with rays such as ultraviolet rays in the case where a photo-crosslinking agent has been blended. Of these, the method in which the organic peroxide is blended, and the molding is heated to crosslink is preferred, since the method can be conducted with ease.

A temperature at which a crosslinking reaction is caused is mainly determined by a combination of an organic peroxide and a crosslinking aid. However, the crosslinking is conducted by heating a molding to a temperature of generally 80 to 350° C., preferably 120 to 300° C., more preferably 150 to 250° C. Crosslinking time is preferably determined to be about 4 times as much as the half-life of the organic peroxide, and is generally 5 to 120 minutes, preferably 10 to 90 minutes, more preferably 20 to 60 minutes. When a crosslinking agent (hardener) capable of exhibiting its effect by heat is used as the crosslinking agent, crosslinking is caused by heating. When a photo-crosslinking agent as the crosslinking agent, crosslinking can be caused by irradiation of light. When crosslinkable moldings are laminated and then crosslinked, fusion bonding and crosslinking occur between the respective layers, thereby obtaining an integral crosslinked molding.

(5) Crosslinked Molding:

Examples of crosslinked molding according to the present invention include laminated sheets, circuit boards, interlayer insulating films and films for forming moistureproof layers.

The crosslinked moldings according to the present invention generally have a water absorption of at most 0.03%, and a dielectric constant of 2.0 to 4.0 and a dielectric loss tangent of 0.0005 to 0.005 as measured at a frequency of 1 MHz. Therefore, the moldings according to the present invention are superior in moisture resistance and electrical properties to the conventional thermoset moldings. The heat resistance of the crosslinked moldings according to the present invention is equal to that of the conventional thermoset moldings. Accordingly, even when a laminated sheet on which a copper foil has been laminated is brought into contact with a solder of 260° C. for 30 seconds, abnormality such as separation of the copper foil and/or occurrence of blister is not observed. The crosslinked molding according to the present invention has excellent adhesion property to the copper foil as demonstrated by a peel strength of 1.4 to 2.2 kg/cm². This is far improved compared with the conventional thermoplastic norbornene resins. From these results, the laminated sheets according to the present invention, which are crosslinked moldings, are suitable for use as circuit boards.

Moldings obtained by using the thermoplastic norbornene polymer compositions according to the present invention as thermoplastic resins are useful as electronic parts such as connectors, relays and capacitors; electronic parts such as injection-molded sealing parts for semiconductor devices such as transistor, IC and LSI; and body tubes for optical lenses and parts for polygon mirrors, Fθ mirrors and the like.

When the thermoplastic norbornene polymer compositions according to the present invention are used in a state dissolved in an organic solvent, they are useful for uses such as sealing materials for potting and cast molding.

When the thermoplastic norbornene polymer compositions according to the present invention are used as transfer molding materials, they are useful as packaging (sealing) materials for semiconductor devices.

The thermoplastic norbornene polymer compositions according to the present invention can be used in the form of a film. In the case where the composition is used as a film, there are cases ① where the norbornene polymer composition is dissolved in an organic solvent, and the solution is formed into a film by a casting process or the like in advance to use it, ② where the solution is applied, and the solvent is then removed to use a film formed as an overcoat, and ③ where a process of applying and drying the solution to form an insulating film, forming a wiring layer thereon, and further applying and drying the solution on the wiring layer to form an insulating film is conducted necessary times repeatedly (sequential formation of a multi-layer insulating film). More specifically, such films are useful as, for example, insulating sheets for laminated sheets, interlayer insulating films, liquid sealing materials for semiconductor devices, overcoating materials, etc.

EXAMPLES

The present invention will hereinafter be described specifically by the following Synthesis Examples, Examples and Comparative Examples. All designations of "part" or "parts" and "%" as will be used in these examples mean part or parts by weight and wt. % unless expressly noted.

Physical properties were measured in accordance with the following methods:

(1) The molecular weight was determined in terms of polystyrene as measured by gel permeation chromatography (GPC) using toluene as a solvent unless expressly noted.
(2) The rates of hydrogenation in the main chain and side chain were determined by ¹H-NMR.
(3) The copolymerization ratio was determined by ¹H-NMR.
(4) The dielectric constant and dielectric loss tangent at 1 MHz were determined in accordance with JIS K 6911.
(5) The adhesion property to a copper foil (copper foil peeling strength) was determined in terms of the 1-cm wide peel strength of a copper plated layer in accordance with JIS C 6481. More specifically, a specimen 20 mm wide and 100 mm long was cut out of a laminate sample, parallel notches were cut at an interval of 10 mm in the copper foil surface of the specimen, and the copper foil was continuously peeled off at a rate of 50 mm/min in a direction perpendicular to the surface by a tensile tester. The copper foil peeling strength was expressed in terms of the minimum stress value at this time.
(6) The glass transition temperature (Tg) was measured in accordance with DSC.
(7) The heat resistance was determined in the following manner. After a test sample was brought into contact with a solder of 300° C. for 1 minute, the appearance of the sample was observed to evaluate it in accordance with the following standard:

Good: Neither separation nor blister was observed;

Poor: Separation or blister was observed.

Synthesis Example 1

A 1-liter flask purged with nitrogen was charged with 5 g of 8-ethyltetracyclo-[4.4.0.1$^{2,5}$.1$^{7,10}$]-3-dodecene (hereinafter referred to as "ETD") and 120 g of toluene, followed by addition of 0.287 mmol of triisobutylaluminum and 0.287 mmol of isobutyl alcohol as polymerization catalysts, and 2.30 mmol of 1-hexene as a molecular weight modifier. To the mixture, 0.057 mmol of tungsten hexachloride was added, and stirring was conducted at 40° C. for 5 minutes. Thereafter, 45 g of ETD and 0.086 mmol of tungsten hexachloride were continuously added dropwise to the reaction system over about 30 minutes. After completion of the addition, stirring was continued for additional 30 minutes to complete polymerization.

This polymerization reaction mixture was transferred to a 1-liter autoclave, and 160 g of toluene were added thereto. After a mixture of 0.5 g of nickel acetylacetonate and 5.15 g of a 30% toluene solution of triisobutylaluminum was then added, and the interior of the autoclave was purged with hydrogen, the contents were heated to 80° C. with stirring. The hydrogen pressure was raised to 30 kg/cm² at the time the temperature was stable, thereby conducting a reaction for 3 hours while supplying hydrogen consumed in the course of the reaction.

Then, 4.2 g of water and 2.5 g of activated alumina (specific surface area: 320 cm²/g; pore volume: 0.8 cm³/g; average particle size: 15 μm; Neobead D powder, product of Mizusawa Industrial Chemicals, Inc.) were added to the reaction mixture, followed by stirring at 80° C. for 1 hour. Solids were then separated by filtration, and the resultant hydrogenation reaction mixture was poured into 3 liters of isopropyl alcohol to deposit a resin formed. The resin was collected by filtration and then dried for 48 hours at 100° C.

under 1 Torr or lower. The result of the synthesis is shown in Table 1. The polymer thus obtained is referred to as A.

Synthesis Example 2

White powder was obtained in the same manner as in Synthesis Example 1 except that the amount of 1-hexene was changed from 2.30 mmol to 8.61 mmol. The result of the synthesis is shown in Table 1. The polymer thus obtained is referred to as B.

Synthesis Example 3

White powder was obtained in the same manner as in Synthesis Example 1 except that ETD was changed to 1,4-methano-1,4,4a,9a-tetrahydrofluorene (hereinafter referred to as "MTF"). The result of the synthesis is shown in Table 1. The polymer thus obtained is referred to as C.

Synthesis Example 4

A 1-liter polymerizer purged with nitrogen was charged with a cyclohexane solution of tetracyclododecene (hereinafter referred to as "TCD"), and a cyclohexane solution of $VO(OC_2H_5)Cl_2$ and a cyclohexane solution of ethylaluminum sesquichloride $[Al(C_2H_5)_{1.5}Cl_{1.5}]$ as catalysts in such a manner that their concentrations within the polymerizer amounted to 60 g/liter, 0.5 mmol/liter and 4.0 mmol/liter, respectively. To the mixture, ethylene and hydrogen were fed at rates of 15 liters/hr and 0.5 liters/hr, respectively, and the temperature within the system was controlled to 10° C. On the other hand, the polymerization reaction mixture was continuously taken out of the upper part of the polymerizer in such a manner that the total amount of the polymerization reaction mixture within a flask amounted to 1 liter, and average residence time was 0.5 hours.

A small amount of isopropyl alcohol was added to the polymerization reaction mixture taken out to terminate the polymerization. Thereafter, an aqueous solution containing concentrated hydrochloric acid in a proportion of 5 ml per liter of water was brought into contact with the polymerization reaction mixture at a ratio of 1:1 under vigorous stirring by means of a homogenizer, thereby transferring the remaining catalysts to an aqueous phase. After the mixed solution was left to rest to remove the aqueous phase, the residue was further washed twice with distilled water, thereby purifying and isolating the polymerization reaction mixture. This polymerization reaction mixture was poured into 3 liters of acetone to deposit a resin formed. The resin was collected by filtration and then dried for 48 hours at 100° C. under 1 Torr or lower, thereby obtaining white powder. The result of the synthesis is shown in Table 1. The polymer thus obtained is referred to as D.

Synthesis Example 5

White powder was obtained in the same manner as in Synthesis Example 4 except that TCD was changed to MTF. The result of the synthesis is shown in Table 1. The polymer thus obtained is referred to as E.

TABLE 1

|  | Polymer | | Polymerization method | Hydrogenation rate of main chain (%) | Hydrogenation rate of nucleus (%) | Molecular weight | | |
| --- | --- | --- | --- | --- | --- | --- | --- | --- |
|  | Code | Composition (mol %) |  |  |  | Mn × $10^4$ | Mw × $10^4$ | Mw/Mn |
| Syn. Ex. 1 | A | ETD (100) | Ring-opening | ≧99 | — | 2.85 | 5.78 | 2.03 |
| Syn. Ex. 2 | B | ETD (100) | Ring-opening | ≧99 | — | 0.81 | 1.34 | 1.66 |
| Syn. Ex. 3 | C | MTF (100) | Ring-opening | ≧99 | ≈0 | 3.12 | 5.58 | 1.79 |
| Syn. Ex. 4 | D | TCD/ethylene (38/62) | Addition | — | — | 4.71 | 8.33 | 1.77 |
| Syn. Ex. 5 | E | MTF/ethylene (37/63) | Addition | — | — | 1.05 | 3.78 | 3.60 |

Synthesis Example 6

A 1-liter flask purged with nitrogen was charged with 18 of 4,4'-diaminodiphenyl ether, 2.5 g of 1,3-bis-(aminopropyl)tetramethyldisiloxane and 300 g of N-methylpyrrolidone, and the mixture was stirred into a solution. To this solution, were then gradually added 32 g of 3,3',4,4'-tetrabenzophenonetetracarboxylic acid dehydrate. After completion of the addition, the resultant mixture was stirred for additional 5 hours to obtain a polyamide acid having a viscosity of 20 poises (25° C.). This solution was poured into 3 liters of isopropyl alcohol to deposit a resin formed. The resin was collected by filtration and then dried for 48 hours at 70° C. under 1 Torr or lower. The polymer thus obtained is referred to as PI and was used as a thermosetting resin.

Examples 1 to 18

The individual thermoplastic norbornene polymers obtained in Synthesis Examples 1 to 5 and various kinds of components were blended so as to give their corresponding compositions shown in Table 2, and the thus-obtained compositions were separately dissolved in toluene to give a solids concentration of 20%, thereby preparing respective varnishes. All the compositions were provided as uniform solutions without forming any precipitate.

An E glass cloth was impregnated with each of these solutions and then dried in an air oven to prepare a curable composite material (prepreg). The weight of the base material in the prepreg was controlled to 40% based on the prepreg. As needed, plural sheets of the thus-produced prepreg were stacked on one another so as to give a thickness of 0.8 mm after molding, and a copper foil 35 μm thick was placed on both sides thereof. The thus-obtained laminate was molded and set by a hot pressing machine to obtain a crosslinked laminate.

Various physical properties of the respective crosslinked laminates obtained in such a manner were measured. The results thereof are shown in Table 2. It is understood from Table 2 that the crosslinked laminates according to the present invention (Examples 1 to 18) all exhibit good dielectric properties and excellent peel strength to the copper foil.

Comparative Examples 1 to 6

The individual thermoplastic norbornene polymers obtained in Synthesis Examples 1 to 5 and various kinds of components were blended so as to give their corresponding compositions shown in Table 2 to obtain crosslinked laminates in the same manner as in the above Examples. Various physical properties of the respective crosslinked laminates thus obtained were measured. The results thereof are shown in Table 2. It is understood from Table 2 that the crosslinked laminates (Comparative Examples 1 to 5), in which no thermosetting resin was used as a blending component, are all poor in peel strength to the copper foil. It is also understood that although the crosslinked laminate (Comparative Example 6), in which the amount of the thermosetting resin blended was extremely great, is excellent in peel strength to the copper foil, the strength is almost equal to the values in Examples 2, 3, 6, 7, 8, 11, 14 and 17, and that such a laminate is not preferred because its electrical properties such as dielectric constant and dielectric loss tangent are deteriorated.

TABLE 2

| | Polymer (part) | Peroxide (part) | Crosslinking aid (part) | Blending compt. (part) | Hardener (part) | Dielec. const. $\epsilon$ | Dielec. loss tangent tan δ | Copper foil peeling strength (kg/cm$^2$) |
|---|---|---|---|---|---|---|---|---|
| Ex. 1 | A (80) | a (1) | TAIC(5) | b1(20) | *1 (1) | 3.00 | 0.0008 | 1.4 |
| Ex. 2 | A (60) | a (1) | TAIC(5) | b1(40) | *1 (1) | 3.00 | 0.0010 | 1.8 |
| Ex. 3 | A (70) | a (1) | TAIC(5) | b2(30) | *1 (1) | 3.00 | 0.0010 | 1.8 |
| Ex. 4 | A (70) | a (1) | TAIC(5) | PI(30) | — | 2.90 | 0.0008 | 1.4 |
| Ex. 5 | B (90) | a (1) | TAIC(5) | b1(10) | *1 (1) | 3.00 | 0.0008 | 1.4 |
| Ex. 6 | B (70) | a (1) | TAIC(5) | b1(30) | *1 (1) | 3.00 | 0.0010 | 1.8 |
| Ex. 7 | B (50) | a (1) | TAIC(5) | b1(50) | *1 (1) | 3.00 | 0.0030 | 1.9 |
| Ex. 8 | B (70) | a (1) | TAIC(5) | b2(30) | *1 (1) | 3.00 | 0.0010 | 1.8 |
| Ex. 9 | B (70) | a (1) | TAIC(5) | PI(30) | — | 2.90 | 0.0008 | 1.4 |
| Ex. 10 | C (70) | a (1) | TAIC(5) | b1(30) | *1 (1) | 3.00 | 0.0010 | 1.7 |
| Ex. 11 | C (70) | a (1) | TAIC(5) | b2(30) | *1 (1) | 3.00 | 0.0010 | 1.8 |
| Ex. 12 | C (70) | a (1) | TAIC(5) | PI(30) | — | 2.95 | 0.0008 | 1.5 |
| Ex. 13 | D (70) | a (1) | TAIC(5) | b1(30) | *1 (1) | 3.00 | 0.0010 | 1.7 |
| Ex. 14 | D (70) | a (1) | TAIC(5) | b2(30) | *1 (1) | 3.00 | 0.0010 | 1.8 |
| Ex. 15 | D (70) | a (1) | TAIC(5) | PI(30) | — | 2.90 | 0.0008 | 1.5 |
| Ex. 16 | E (70) | a (1) | TAIC(5) | b1(30) | *1 (1) | 3.00 | 0.0010 | 1.7 |
| Ex. 17 | E (70) | a (1) | TAIC(5) | b2(30) | *1 (1) | 3.00 | 0.0010 | 1.8 |
| Ex. 18 | E (70) | a (1) | TAIC(5) | PI(30) | — | 2.95 | 0.0008 | 1.5 |
| Comp. Ex. 1 | A (50) | a (1) | TAIC(5) | b3(50) | — | 3.55 | 0.0022 | 1.1 |
| Comp. Ex. 2 | B (50) | a (1) | TAIC(5) | b3(50) | — | 3.51 | 0.0025 | 1.1 |
| Comp. Ex. 3 | C (50) | a (1) | TAIC(5) | b3(50) | — | 3.46 | 0.0032 | 1.2 |
| Comp. Ex. 4 | D (50) | a (1) | TAIC(5) | b3(50) | — | 3.54 | 0.0030 | 1.1 |
| Comp. Ex. 5 | E (50) | a (1) | TAIC(5) | b3(50) | — | 3.77 | 0.0038 | 1.2 |
| Comp. Ex. 6 | E (30) | a (1) | TAIC(5) | b1(70) | *1 (1) | 3.50 | 0.0040 | 1.9 |

(Note)
*1: Imidazole;
① Peroxide a: 2,5-Dimethyl-2,5-di(t-butyl peroxy)hexyne-3;
② TAIC: Triallyl isocyanurate;
③ Imidazole: 2-Ethyl-4-methylimidazole;
④ Blending component b1: Bisphenol A type epoxy resin (AER 6071, product of Asahi-CIBA Limited);
⑤ Blending component b2: Brominated bisphenol A type epoxy resin (AER 8010, product of Asahi-CIBA Limited);
⑥ Blending component b3: Brominated bisphenol A type flame retardant (Plasafety EB-242, product of Manack Co.);
⑦ PI: Thermosetting resin prepared in Synthesis Example 6.

Synthesis Example 7

Preparation of Epoxy-modified Norbornene Polymer (Polymerization)

An addition copolymer of 2-norbornene (NB) and 5-phenyl-2-norbornene (PhNB) [number average molecular weight (Mn)=66,400, weight average molecular weight (Mw)=140,000, both, in terms of polystyrene; compositional ratio NB/PhNB of monomers=68/32 (molar ratio); Tg=285° C.] was obtained in accordance with the publicly known process described in U.S. Pat. No. 5,468,819. This polymer is referred to as F.

(Epoxy modification)

Dissolved in 130 parts of t-butylbenzene were 28.5 parts of the thus-obtained norbornene addition copolymer, 10 parts of 5,6-epoxy-1-hexene and 2 parts of dicumyl peroxide, and a reaction was conducted at 140° C. for 6 hours. A solution of the resultant reaction product was poured into 300 parts of methanol to solidify the reaction product. The reaction product thus solidified was dried under reduced pressure at 100° C. for 20 hours, thereby obtaining 26 parts of an epoxy-modified norbornene addition polymer. This modified polymer had Mn of 70,000, Mw of 174,200 and Tg of 267° C. The epoxy group content in the modified polymer was 7.5% per repeating structural unit of the polymer as measured by $^1$H-NMR. This polymer is referred to as G.

Synthesis Example 8

Preparation of Epoxy-modified Norbornene Polymer (Polymerization)

A terpolymer of NB/PhNB/5-ethylidene-2-norbornene (ENB) [number average molecular weight (Mn)=54,100, weight average molecular weight (Mw)=116,600, both, in terms of polystyrene; compositional ratio NB/PhNB/ENB of monomers=62/23/15 (molar ratio); Tg=320° C.] was obtained in the same manner as in Synthesis Example 7.

(Epoxy modification)

Thirty parts of the thus-obtained norbornene terpolymer were added to 120 parts of toluene and heated to 120° C. into a solution. To the solution were added 1.2 parts of t-butyl hydroperoxide and 0.09 parts of hexacarbonylmolybdenum, and the mixture was refluxed for 2 hours. The reaction mixture was poured into 100 parts of cold methanol to solidify a reaction product. The reaction product thus solidified was dried under reduced pressure at 80° C. for 20 hours, thereby obtaining 30 parts of an epoxy-modified norbornene addition polymer. This modified polymer had Mn of 55,200, Mw of 134,600 and Tg of 322° C. The epoxy-modified rate to the unsaturated bonds was 100% as measured by $^1$H-NMR, and the epoxy group content in the modified polymer was 15.0% per repeating structural unit of the polymer as measured by $^1$H-NMR. This polymer is referred to as H.

Synthesis Example 9

Preparation of Maleic Acid-modified Norbornene Polymer (Maleic Acid Modification)

Thirty parts of the norbornene copolymer obtained in Synthesis Example 7 were added to 150 parts of toluene and heated to 120° C. into a solution. To the solution were gradually added a solution of maleic anhydride (3 parts) in toluene (100 parts) and a solution of dicumyl peroxide (0.3 parts) in toluene (45 parts), thereby conducting a reaction for 4 hours. The reaction mixture was poured into 600 parts of cold methanol to solidify a reaction product. The reaction product thus solidified was dried under reduced pressure at 80° C. for 20 hours, thereby obtaining 30 parts of a maleic acid-modified norbornene polymer. This modified polymer had Mn of 73,100, Mw of 162,400 and Tg of 276° C. The maleic anhydride content in the modified polymer was 15.5% per repeating structural unit of the polymer as measured by $^1$H-NMR. This polymer is referred to as I.

Synthesis Example 10

Preparation of Hydroxy-modified Norbornene Polymer (Hydroxy Modification)

Thirty parts of the norbornene copolymer obtained in Synthesis Example 8 were added to 300 parts of toluene and heated to 120° C. into a solution. To the solution were gradually added dropwise 50 parts of 90 wt. % formic acid and 7.5 parts of 30 wt. % aqueous hydrogen peroxide, followed by refluxing for 2 hours. The reaction mixture was then neutralized with a methanol solution of sodium hydroxide and poured into 700 parts of acetone to solidify a reaction product. The reaction product thus solidified was dried under reduced pressure at 80° C. for 20 hours, thereby obtaining 30 parts of a hydroxy-modified norbornene polymer. This modified polymer had Mn of 55,100, Mw of 133,400 and Tg of 328° C., The hydroxy-modified rate to the unsaturated bonds was 100% as measured by $^1$H-NMR, and the hydroxyl group content in the modified polymer was 15% per repeating structural unit of the polymer as measured by $^1$H-NMR. This polymer is referred to as J.

Synthesis Example 11

Preparation of Epoxy-modified Norbornene Polymer (Polymerization)

A copolymer of NB/divinylbenzene (DVB) [number average molecular weight (Mn)=34,200, weight average molecular weight (Mw)=78,600, both, in terms of polystyrene; compositional ratio NB/DVB of monomers=90/10 (molar ratio); Tg=302° C.] was obtained in accordance with the publicly known process described in Japanese Patent Application Laid-Open No. 45113/1992.

(Epoxy Modification)

An epoxy-modified product of the thus-obtained norbornene copolymer was obtained in the same manner as in Synthesis Example 7. This modified polymer had Mn of 35,200, Mw of 82,100 and Tg of 302° C. The epoxy-modified rate to the unsaturated bonds was 100% as measured by $^1$H-NMR, and the epoxy group content in the modified polymer was 9.5% per repeating structural unit of the polymer as measured by $^1$H-NMR. This polymer is referred to as K.

Synthesis Example 12

Preparation of Epoxy-modified Norbornene Polymer (Polymerization)

An addition copolymer of NB/ethylene [NB content: 52 mol %; Mn=68,200, Mw=140,100; Tg=154° C.] was obtained in accordance with the publicly known process described in Japanese Patent Application Laid-Open No. 45612/1991.

(Epoxy Modification)

Dissolved in 130 parts of t-butylbenzene were 30 parts of the thus-obtained norbornene/ethylene addition copolymer, 10 parts of 5,6-epoxy-1-hexene and 2 parts of dicumyl peroxide, and a reaction was conducted at 140° C. for 6 hours. A solution of the resultant reaction product was poured into 300 parts of methanol to solidify the reaction product. The reaction product thus solidified was dried under reduced pressure at 100° C. for 20 hours, thereby obtaining 29 parts of an epoxy-modified polymer. This modified polymer had Mn of 72,400, Mw of 152,300 and Tg of 155° C. The epoxy group content in the modified polymer was 2.4% per repeating structural unit of the polymer as measured by $^1$H-NMR. This polymer is referred to as L.

The compositions and physical properties of the modified polymers prepared in Synthesis Examples 7 to 12 are shown in Table 3.

nitrogen atmosphere. Various physical properties of the thus-obtained thermoset norbornene polymer composition were measured. As a result, it was found that the dielectric constant $\epsilon$ and dielectric loss tangent tan $\delta$ at a frequency of 1 MHz are 3.00 and 0.0010, respectively, the peel strength (copper foil peeling strength) is 1.8 kg/cm$^2$, and the soldering heat resistance is good.

Example 20

Seventy parts of Polymer H obtained in Synthesis Example 8 were blended with 30 parts of a brominated bisphenol A type epoxy resin (AER 8010, product of Asahi-CIBA Limited) as a thermosetting resin and 1 part of 2-ethyl-4-methylimidazole as a hardener, and the thus-obtained composition was dissolved in xylene to give a solids concentration of 25%, thereby preparing a varnish.

A film of a thermoset norbornene polymer composition was formed on a copper-clad silicon wafer in the same manner as in Example 19 except that this varnish was used.

Various physical properties of the thus-obtained thermoset norbornene polymer composition were measured. As a result, it was found that the dielectric constant $\epsilon$ and dielectric loss tangent tan $\delta$ at a frequency of 1 MHz are 3.00 and 0.0010, respectively, the peel strength is 1.8 kg/cm$^2$, and the soldering heat resistance is good.

Example 21

Seventy parts of Polymer I obtained in Synthesis Example 9 were blended with 30 parts of PI obtained in Synthesis

TABLE 3

| | | Unmodified polymer | | | | | Modified polymer | | | |
|---|---|---|---|---|---|---|---|---|---|---|
| Syn. Ex. | Code | Composition (mole %) | Polymerization method | Molecular weight Mn × 10$^4$ | Molecular weight Mw × 10$^4$ | Tg (° C.) | Modifying group | Rate of modification (%) | Molecular weight Mn × 10$^4$ | Molecular weight Mw × 10$^4$ | Tg (° C.) |
| 7 | F | NB/PhNB (68/32) | Addition | 6.64 | 14.01 | 285 | — | — | — | — | — |
| | G | NB/PhNB (66/32) | Addition | 6.64 | 14.01 | 285 | Epoxy | 7.5 | 7.01 | 17.42 | 267 |
| 8 | H | NB/PhNB/ENB (62/23/15) | Addition | 5.41 | 11.66 | 320 | Epoxy | 15.0 | 5.52 | 13.46 | 322 |
| 9 | I | NB/PhNB (68/32) | Addition | 6.64 | 14.01 | 285 | Maleic | 15.5 | 7.31 | 16.24 | 276 |
| 10 | J | NB/PhNB/ENB (62/23/15) | Addition | 5.41 | 11.66 | 320 | Hydroxyl | 15.0 | 5.51 | 13.34 | 328 |
| 11 | K | (NB//DVB) (90/10) | Addition | 3.42 | 7.86 | 302 | Epoxy | 9.5 | 3.52 | 8.21 | 302 |
| 12 | L | NB/ethylene (52/48) | Addition | 6.82 | 14.01 | 154 | Epoxy | 2.4 | 7.24 | 15.23 | 155 |

Example 19

Sixty parts of Polymer G obtained in Synthesis Example 7 were blended with 40 parts of a bisphenol A type epoxy resin (AER 6071, product of Asahi-CIBA Limited) as a thermosetting resin and 1 part of 2-ethyl-4-methyl-imidazole as a hardener, and the thus-obtained composition was dissolved in xylene to give a solids concentration of 25%, thereby preparing a varnish.

After the solution was filtered through a precision filter made of polytetrafluoroethylene (PTFE) having a pore size of 0.22 $\mu$m, it was coated on a copper-clad silicon wafer 4 inches across by means of a spinner, prebaked at 90° C. for 120 seconds and then heat-cured at 200° C. for 1 hour in a Example 6 as a thermosetting resin, 1 part of 2,5-dimethyl-2,5-di(t-butyl peroxy)hexyne-3 as a peroxide and 5 parts of triallyl isocyanurate as a hardening aid, and the thus-obtained composition was dissolved in xylene to give a solids concentration of 25%, thereby preparing a varnish.

A film of a thermoset norbornene polymer composition was formed on a copper-clad silicon wafer in the same manner as in Example 19 except that this varnish was used.

Various physical properties of the thus-obtained thermoset norbornene polymer composition were measured. As a result, it was found that the dielectric constant $\epsilon$ and dielec tric loss tangent tan δ at a frequency of 1 MHz are 2.90 and 0.0008, respectively, the peel strength is 1.5 kg/cm$^2$, and the soldering heat resistance is good.

Example 22

Seventy parts of Polymer J obtained in Synthesis Example 10 were blended with 30 parts of a bisphenol A type epoxy resin (AER 6071, product of Asahi-CIBA Limited) as a thermosetting resin, 1 part of 2-ethyl-4-methylimidazole as a hardener, 1 part of 2,5-dimethyl-2,5-di(t-butyl peroxy) hexyne-3 as a peroxide and 5 parts of triallyl isocyanurate as a hardening aid, and the thus-obtained composition was dissolved in xylene to give a solids concentration of 25%, thereby preparing a varnish.

A film of a thermoset norbornene polymer composition was formed on a copper-clad silicon wafer in the same manner as in Example 19 except that this varnish was used.

Various physical properties of the thus-obtained thermoset norbornene polymer composition were measured. As a result, it was found that the dielectric constant ε and dielectric loss tangent tan δ at a frequency of 1 MHz are 3.00 and 0.0010, respectively, the peel strength is 1.8 kg/cm$^2$, and the soldering heat resistance is good.

Example 23

Seventy parts of Polymer K obtained in Synthesis Example 11 were blended with 30 parts of a brominated bisphenol A type epoxy resin (AER 8010, product of Asahi-CIBA Limited) as a thermosetting resin and 1 part of 2-ethyl-4-methylimidazole as a hardener, and the thus-obtained composition was dissolved in xylene to give a solids concentration of 25%, thereby preparing a varnish.

A film of a thermoset norbornene polymer composition was formed on a copper-clad silicon wafer in the same manner as in Example 19 except that this varnish was used.

Various physical properties of the thus-obtained thermoset norbornene polymer composition were measured. As a result, it was found that the dielectric constant ε and dielectric loss tangent tan δ at a frequency of 1 MHz are 3.00 and 0.0010, respectively, the peel strength is 1.8 kg/cm$^2$, and the soldering heat resistance is good.

Example 24

Seventy parts of the unmodified norbornene addition polymer F obtained in Synthesis Example 6 were blended with 30 parts of a bisphenol A type epoxy resin (AER 6071, product of Asahi-CIBA Limited) as a thermosetting resin, 1 part of 2-ethyl-4-methylimidazole as a hardener, 1 part of 2,5-dimethyl-2,5-di(t-butyl peroxy)hexyne-3 as a peroxide and 5 parts of triallyl isocyanurate as a hardening aid, and the thus-obtained composition was dissolved in xylene to give a solids concentration of 25%, thereby preparing a varnish.

A film of a thermoset norbornene polymer composition was formed on a copper-clad silicon wafer in the same manner as in Example 19 except that this varnish was used.

Various physical properties of the thus-obtained thermoset norbornene polymer composition were measured. As a result, it was found that the dielectric constant ε and dielectric loss tangent tan δ at a frequency of 1 MHz are 3.00 and 0.0010, respectively, the peel strength is 1.8 kg/cm$^2$, and the soldering heat resistance is good.

Example 25

An experiment was carried out in the same manner as in Example 19 except that Polymer L obtained in Synthesis Example 12 was used.

Various physical properties of the thus-obtained thermoset norbornene polymer composition were measured. As a result, it was found that the dielectric constant ε and dielectric loss tangent tan δ at a frequency of 1 MHz are 3.00 and 0.0010, respectively, and the peel strength is 1.4 kg/cm$^2$, and so both electrical properties and adhesion property are good. However, in the evaluation of the soldering heat resistance, blister was observed. This indicates that the soldering heat resistance at 300° C. became insufficient because the glass transition temperature of Polymer L used was not sufficiently high.

Comparative Example 7

An experiment was carried out in the same manner as in Example 19 except that the bisphenol A type epoxy resin (AER 6071, product of Asahi-CIBA Limited) was not blended.

Various physical properties of the thus-obtained thermoset norbornene polymer composition were measured. As a result, it was found that the dielectric constant ε and dielectric loss tangent tan δ at a frequency of 1 MHz are 2.65 and 0.0005, respectively, and the peel strength is 1.0 kg/cm$^2$ or lower, and so the adhesion property to copper is insufficient. The soldering heat resistance was good.

Comparative Example 8

An experiment was carried out in the same manner as in Example 24 except that the bisphenol A type epoxy resin (AER 6071, product of Asahi-CIBA Limited) was not blended.

Various physical properties of the thus-obtained thermoset norbornene polymer composition were measured. As a result, it was found that the dielectric constant ε and dielectric loss tangent tan δ at a frequency of 1 MHz are 2.65 and 0.0005, respectively, and the peel strength is 1.0 kg/cm$^2$ or lower, and so the adhesion property to copper is insufficient. The soldering heat resistance was good.

Comparative Example 9

An experiment was carried out in the same manner as in Example 19 except that the amounts of the norbornene addition polymer G obtained in Synthesis Example 7 and the bisphenol A type epoxy resin (AER 6071, product of Asahi-CIBA Limited) as the thermosetting resin were changed to 30 parts and 70 parts, respectively.

Various physical properties of the thus-obtained thermoset norbornene polymer composition were measured. As a result, it was found that the dielectric constant ε and dielectric loss tangent tan δ at a frequency of 1 MHz are 3.55 and 0.0040, respectively, and so the electrical properties are poor. The peel strength was 1.9 kg/cm$^2$, and the soldering heat resistance was good.

The results of Examples 19 to 25 and Comparative Examples 7 to 9 are shown in Table 4.

TABLE 4

|  | Polymer (part) | Peroxide (part) | Crosslinking aid (part) | Blending compt. (part) | Hardener (part) | Dielec. const. ∈ | Dielec. loss tangent tan δ | Copper foil peeling strength (kg/cm²) |
|---|---|---|---|---|---|---|---|---|
| Ex. 19 | G (60) | — | — | b1(40) | *1 (1) | 3.00 | 0.0010 | 1.8 |
| Ex. 20 | H (70) | — | — | b2(30) | *1 (1) | 3.00 | 0.0010 | 1.8 |
| Ex. 21 | I (70) | a (1) | TAIC(5) | PI(30) | — | 2.90 | 0.0008 | 1.5 |
| Ex. 22 | J (70) | a (1) | TAIC(5) | b1(30) | *1 (1) | 3.00 | 0.0010 | 1.8 |
| Ex. 23 | K (70) | — | — | b2(30) | *1 (1) | 3.00 | 0.0010 | 1.8 |
| Ex. 24 | F (70) | a (1) | TAIC(5) | b1(30) | *1 (1) | 3.00 | 0.0010 | 1.8 |
| Ex. 25 | L (60) | — | — | b1(40) | *1 (1) | 3.00 | 0.0010 | 1.4 |
| Comp. Ex. 7 | G (60) | — | — | — | — | 2.65 | 0.0005 | ≦1.0 |
| Comp. Ex. 8 | F (70) | a (1) | TAIC(5) | — | — | 2.65 | 0.0005 | ≦1.0 |
| Comp. Ex. 9 | G (30) | — | — | b1(70) | *1 (1) | 3.55 | 0.0040 | 1.9 |

(Note)
*1: Imidazole;
① Peroxide a: 2,5-Dimethyl-2,5-di(t-butyl peroxy)hexyne-3;
② TAIC: Triallyl isocyanurate;
③ Imidazole: 2-Ethyl-4-methylimidazole;
④ Blending component b1: Bisphenol A type epoxy resin (AER 6071, product of Asahi-CIBA Limited);
⑤ Blending component b2: Brominated bisphenol A type epoxy resin (AER 8010, product of Asahi-CIBA Limited);
⑥ Blending component b3: Brominated bisphenol A type flame retardant (Plasafety EB-242, product of Manack Co.);
⑦ PI: Thermosetting resin prepared in Synthesis Example 6.

Synthesis Example 13

Preparation of Epoxy-modified Norbornene Polymer

Fifty parts of Polymer A obtained in Synthesis Example 1 were blended with 3 parts of allyl glycidyl ether, 0.8 parts of dicumyl peroxide and 120 parts of t-butylbenzene to conduct a reaction at 150° C. for 3 hours in an autoclave. The reaction mixture was then poured into a great amount of isopropyl alcohol to deposit a polymer formed, and the polymer is collected by filtration and dried to obtain epoxy-modified Polymer M. The result is shown in Table 5.

Synthesis Example 14

Preparation of Maleic Acid-modified Norbornene Polymer

Maleic acid-modified Polymer N was obtained in the same manner as in Synthesis Example 13 except that allyl glycidyl ether was changed to maleic anhydride. The result is shown in Table 5.

Synthesis Example 15

Preparation of Epoxy-modified Norbornene Polymer

Epoxy-modified Polymer O was obtained in the same manner as in Synthesis Example 13 except that Polymer A was changed to Polymer C obtained in Synthesis Example 3. The result is shown in Table 5.

Synthesis Example 16

Preparation of Maleic Acid-modified Norbornene Polymer

Maleic acid-modified Polymer P was obtained in the same manner as in Synthesis Example 14 except that Polymer A was changed to Polymer C obtained in Synthesis Example 3. The result is shown in Table 5.

TABLE 5

| | Unmodified polymer | | | | Modified polymer | | | | | |
|---|---|---|---|---|---|---|---|---|---|---|
| Syn. Ex. | Code | Composition (mol %) | Polymerization method | Hydrogenation rate of main chain (%) | Modifying group | Rate of modification (%) | Mn × 10⁴ | Mw × 10⁴ | Tg (° C.) | Code |
| 13 | A | ETD (100) | Ring-opening | ≧99 | Epoxy | 12.0 | 2.72 | 5.55 | 163 | M |
| 14 | A | ETD (100) | Ring-opening | ≧99 | Maleic | 10.0 | 2.79 | 5.66 | 154 | N |
| 15 | C | MTF (100) | Ring-opening | ≧99 | Epoxy | 16.0 | 2.74 | 5.44 | 168 | O |
| 16 | C | MTF (100) | Ring-opening | ≧99 | Maleic | 11.0 | 3.08 | 6.28 | 154 | P |

Examples 26 to 29

The individual thermoplastic norbornene polymers obtained in Synthesis Examples 13 to 16 and various kinds of components were blended so as to give their corresponding compositions shown in Table 6, and the thus-obtained compositions were separately dissolved in xylene to give a solids concentration of 25%, thereby preparing respective varnishes.

Films of thermoset norbornene polymer compositions were separately formed on a copper-clad silicon wafer in the same manner as in Example 19 except that these varnishes were used.

Various physical properties of the thus-obtained thermoset norbornene polymer compositions were measured. The results are shown in Table 6.

TABLE 6

|  | Polymer (part) | Peroxide (part) | Cross-linking aid (part) | Blending compt. (part) | Hardener (part) | Dielec. const. ∈ | Dielec. loss tangent tan δ | Copper foil peeling strength (kg/cm$^2$) |
|---|---|---|---|---|---|---|---|---|
| Ex. 26 | M (70) | a (1) | TAIC(5) | b1(30) | *1 (1) | 3.03 | 0.0012 | 1.9 |
| Ex. 27 | N (70) | a (1) | TAIC(5) | b1(30) | *1 (1) | 3.05 | 0.0015 | 2.0 |
| Ex. 28 | O (70) | a (1) | TAIC(5) | b1(30) | *1 (1) | 3.05 | 0.0015 | 2.1 |
| Ex. 29 | P (70) | a (1) | TAIC(5) | b1(30) | *1 (1) | 3.07 | 0.0020 | 2.2 |

(Note)
*1: Imidazole;
① Peroxide a: 2,5-Dimethyl-2,5-di(t-butyl peroxy)hexyne-3;
② TAIC: Triallyl isocyanurate;
③ Imidazole: 2-Ethyl-4-methylimidazole;
④ Blending component b1: Bisphenol A type epoxy resin (AER 6071, product of Asahi-CIBA Limited).

INDUSTRIAL APPLICABILITY

According to the present invention, there are provided norbornene polymer compositions excellent in electrical properties such as dielectric constant and dielectric loss tangent and also in adhesion property to metals, moldings thereof, and sheets, films, prepregs, laminates and the like using such a composition. The norbornene polymer compositions according to the present invention can be applied to a wide variety of fields such as circuits boards, semiconductor devices and electronic parts in precision apparatus such as electronic computers and communication machines.

What is claimed is:

1. A norbornene polymer composition comprising 100 parts by weight of a thermoplastic norbornene polymer selected from the group consisting of hydrogenated products of ring-opening polymers of a norbornene monomer, addition polymers of a norbornene monomer, addition polymers of a norbornene monomer and another monomer, and products of these norbornene polymers obtained by introducing a polar group selected from the group consisting of epoxy, carboxyl, hydroxyl, ester, silanol, amino, nitrile, halogen, acyl, sulfonic and carboxylic acid anhydride groups into the norbornene polymers, and 1 to 150 parts by weight of a thermosetting resin.

2. The norbornene polymer composition according to claim 1, which further comprises a crosslinking agent in a proportion of 0.001 to 30 parts by weight per 100 parts by weight of the thermoplastic norbornene polymer.

3. The norbornene polymer composition according to claim 1, wherein the products of the norbornene polymers are those obtained by introducing a polar group into the norbornene polymers by the graft reaction of the norbornene polymers with a polar group-containing unsaturated compound.

4. The norbornene polymer composition according to claim 3, wherein the polar group-containing unsaturated compound is an unsaturated epoxy compound and the polar group introduced is an epoxy group.

5. The norbornene polymer composition according to claim 3, wherein the polar group-containing unsaturated compound is an unsaturated carboxylic compound, and the polar group introduced is a carboxyl or carboxylic acid anhydride group.

6. The norbornene polymer composition according to claim 1, wherein the products of the norbornene polymers are those obtained by introducing a polar group into the norbornene polymers by the reaction of carbon-carbon unsaturated bonds in the norbornene polymer with a polar group-introducing agent.

7. The norbornene polymer composition according to claim 6, wherein the polar group-introducing agent is a peroxide, and the polar group introduced is an epoxy group.

8. The norbornene polymer composition according to claim 6, wherein the polar group-introducing agent is formic acid and hydrogen peroxide, and the polar group introduced is a hydroxyl group.

9. The norbornene polymer composition according to claim 1, wherein the rate of introduction of a polar group in the products is each 0.1 to 100 mol % based on the total number of monomer units in each polymer.

10. The norbornene polymer composition according to claim 1, wherein the thermoplastic norbornene polymer is selected from the group consisting of addition polymers of norbornene monomers, which each have a glass transition temperature of at least 180° C., and the products of the addition polymers.

11. The norbornene polymer composition according to claim 1, wherein the thermosetting resin is an epoxy resin.

12. The norbornene polymer composition according to claim 11, wherein the epoxy resin is composed of a combination of a halogenated bisphenol type epoxy compound represented by the formula (E1):

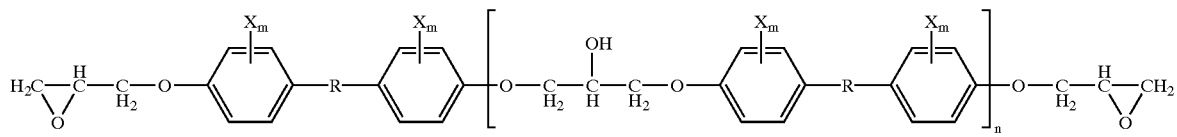

(E1)

wherein X is a halogen atom, R is a divalent hydrocarbon group, m is an integer of 1 to 3, and n is 0 or an integer of at least 1, and a hardener.

13. The norbornene polymer composition according to claim 11, wherein the epoxy resin is composed of a combination of a novolak type epoxy compounds represented by the formula (E2):

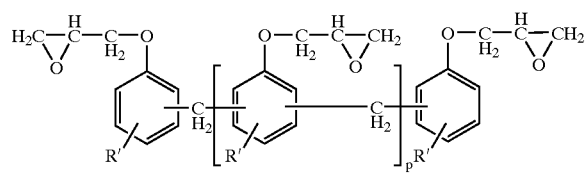

(E2)

wherein R' is a hydrogen atom or alkyl group having 1 to 20 carbon atoms, and p is 0 or an integer of at least 1, and a hardener.

14. The norbornene polymer composition according to claim 1, wherein the thermosetting resin is a polyimide resin.

15. The norbornene polymer composition according to claim 2, wherein the crosslinking agent is an organic peroxide.

16. A molding obtained by using the norbornene polymer composition according to claim 1.

17. A laminate having a structure comprising a layer formed of the norbornene polymer composition according to claim 1 laminated on a metal layer.

18. A prepreg with a reinforcing base material impregnated with the norbornene polymer composition according to claim 1.

19. A norbornene polymer composition comprising 100 parts by weight of a thermoplastic norbornene polymer, 0.001 to 30 parts by weight of a crosslinking agent selected from the group consisting of organic peroxides and crosslinking agents capable of exhibiting their effects by light, and 1 to 150 parts by weight of a thermosetting resin selected from the group consisting of epoxy resins, urea resins, melamine resins, phenol resins, polyimide resins and unsaturated polyester resins.

20. A norbornene polymer composition comprising 100 parts by weight of a thermoplastic norbornene polymer selected from the group consisting of addition polymers of norbornene monomers, which each have a glass transition temperature of at least 180° C., and products of the addition polymers obtained by introducing a polar group selected from the group consisting of epoxy, carboxyl, hydroxyl ester, silanol, amino, nitrile, halogen, acyl, sulfonic acid and carboxylic acid anhydride groups into the addition polymers of norbornene monomers, and 1–150 parts by weight of a thermosetting resin.

21. A norbornene polymer composition comprising 100 parts by weight of a thermoplastic norbornene polymer and 1 to 150 parts by weight of a polyimide resin.

22. The norbornene polymer composition according to claim 1, wherein the thermosetting resin is selected from the group consisting of epoxy resins, urea resins, melamine resins, phenol resins, polyimide resins and unsaturated polyester resins.

23. The norbornene polymer composition according to claim 20, wherein the thermosetting resin is selected from the group consisting of epoxy resins, urea resins, melamine resins, phenol resins, polyimide resins and unsaturated polyester resins.

* * * * *